(12) United States Patent
Mori et al.

(10) Patent No.: US 7,351,674 B2
(45) Date of Patent: Apr. 1, 2008

(54) INSULATING CERAMIC COMPOSITION, INSULATING CERAMIC SINTERED BODY, AND MULITLAYER CERAMIC ELECTRONIC COMPONENT

(75) Inventors: Naoya Mori, Omihachiman (JP); Yoichi Moriya, Omihachiman (JP); Jun Urakawa, Omihachiman (JP); Yasutaka Sugimoto, Kyoto (JP)

(73) Assignee: Murata Manufacturing Co., Ltd., Kyoto-Fu (JP)

( * ) Notice: Subject to any disclaimer, the term of this patent is extended or adjusted under 35 U.S.C. 154(b) by 50 days.

(21) Appl. No.: 10/568,454

(22) PCT Filed: Feb. 2, 2005

(86) PCT No.: PCT/JP2005/001463

§ 371 (c)(1),
(2), (4) Date: Feb. 15, 2006

(87) PCT Pub. No.: WO2005/082806

PCT Pub. Date: Sep. 9, 2005

(65) Prior Publication Data

US 2006/0293168 A1 Dec. 28, 2006

(30) Foreign Application Priority Data

Mar. 1, 2004 (JP) ............................. 2004-055884
May 6, 2004 (JP) ............................. 2004-137388

(51) Int. Cl.
*C03C 14/00* (2006.01)
*C04B 35/20* (2006.01)
*C04B 35/46* (2006.01)
*B32B 17/06* (2006.01)

(52) U.S. Cl. ............................. 501/32; 501/5; 501/134; 501/136; 501/137; 501/122; 428/210; 428/432; 428/701; 428/702

(58) Field of Classification Search .................... 501/5, 501/32, 122, 134, 135, 136, 137, 138, 139; 428/210, 432, 701, 702
See application file for complete search history.

(56) References Cited

U.S. PATENT DOCUMENTS 6,385,035 B1   5/2002   Matoba et al.

(Continued)

FOREIGN PATENT DOCUMENTS

JP          06-191887          7/1994

(Continued)

OTHER PUBLICATIONS

Written Opinion of the International Searching Authority dated May 31, 2005.

*Primary Examiner*—Karl E Group
(74) *Attorney, Agent, or Firm*—Dickstein, Shapiro, LLP.

(57) ABSTRACT

An insulating ceramic composition forming insulating ceramic layers (3) stacked in a multilayer ceramic substrate (2) used in a monolithic ceramic electronic component, such as a multilayer ceramic module (1). The insulating ceramic composition contains a first ceramic powder mainly containing forsterite, a second ceramic powder mainly containing at least one compound selected from the group consisting of $CaTiO_3$, $SrTiO_3$, and $TiO_2$, and a borosilicate glass powder. The borosilicate glass powder contains 3 to 15 percent by weight of lithium in terms of $Li_2O$, 30 to 50 percent by weight of magnesium in terms of MgO, 15 to 30 percent by weight of boron in terms of $B_2O_3$, 10 to 35 percent by weight of silicon in terms of $SiO_2$, 6 to 20 percent by weight of zinc in terms of ZnO, and 0 to 15 percent by weight of aluminum in terms of $Al_2O_3$. The insulating ceramic composition can be fired at a temperature of 1000° C. or less, and the resulting sintered compact has a low relative dielectric constant, a resonance frequency with a low temperature coefficient, and a high Q value.

22 Claims, 5 Drawing Sheets

U.S. PATENT DOCUMENTS

| | | |
|---|---|---|
| 6,448,195 B2 * | 9/2002 | Kishida et al. ............... 501/32 |
| 6,458,734 B1 | 10/2002 | Sugimoto et al. |
| 6,946,415 B2 * | 9/2005 | Chikagawa et al. .......... 501/32 |
| 2006/0287184 A1 * | 12/2006 | Mori et al. ................... 501/32 |
| 2007/0128450 A1 * | 6/2007 | Mori et al. ................. 428/432 |

FOREIGN PATENT DOCUMENTS

| | | |
|---|---|---|
| JP | 06-206736 | 7/1994 |
| JP | 10-106880 | 4/1998 |
| JP | 11-228222 | 8/1999 |
| JP | 11-302034 | 11/1999 |
| JP | 11-310455 | 11/1999 |
| JP | 2000-143332 | 5/2000 |
| JP | 2000-185978 | 7/2000 |
| JP | 2000-344571 | 12/2000 |
| JP | 2001-080959 | 3/2001 |
| JP | 2002-016165 | 1/2002 |
| JP | 2002-097072 | 4/2002 |
| JP | 2002-104870 | 4/2002 |
| JP | 2002-128564 | 5/2002 |
| JP | 2002-265266 | 9/2002 |
| JP | 2003-002682 | 1/2003 |
| JP | 2003-002686 | 1/2003 |
| JP | 2003-026471 | 1/2003 |
| JP | 2003-119076 | 4/2003 |
| JP | 2003-342064 | 12/2003 |
| JP | 3550270 | 4/2004 |

* cited by examiner

INSULATING CERAMIC COMPOSITION, INSULATING CERAMIC SINTERED BODY, AND MULITLAYER CERAMIC ELECTRONIC COMPONENT

TECHNICAL FIELD

The present invention relates to insulating ceramic compositions, particularly an insulating ceramic composition containing a glass component so as to make it possible to be fired at low temperatures, to an insulating ceramic sintered compact prepared by firing the insulating ceramic composition, and to a monolithic ceramic electronic component using the insulating ceramic sintered compact.

BACKGROUND ART

One of the effective approaches for downsizing electronic apparatuses is to use multifunctional electronic components in the electronic apparatuses. Among the multifunctional electronic components are multilayer ceramic modules, for example.

A multilayer ceramic module includes a multilayer ceramic substrate. The multilayer ceramic substrate contains wiring conductors for establishing electrical connections or forming passive elements, such as a capacitor and an inductor, inside. Also, various types of electronic components are disposed on the multilayer ceramic substrate.

The multilayer ceramic module thus can be small and multifunctional, and the use of the multilayer ceramic module can lead to downsized electronic apparatuses.

In addition to the above-described demand for downsizing, use of electronic apparatuses at higher frequencies is increasingly desired. In view of such circumstances, it is desired that multilayer ceramic modules used at high frequencies include a multilayer ceramic substrate having superior high-frequency characteristics. Specifically, it is desired that the insulating ceramic sintered compact forming insulating ceramic layers defining the multilayer structure of the multilayer ceramic substrate has superior characteristics at high frequencies.

In order to provide an insulating ceramic sintered compact capable of satisfying these demands, for example, Japanese Unexamined Patent Application Publication No. 2000-344571 (Patent Document 1) has disclosed an insulating ceramic composition. The insulating ceramic composition of Patent Document 1 is a ternary composition containing forsterite, calcium titanate, and spinel. Patent Document 1 has taught that this insulating ceramic composition exhibits a Qf value of 38000 GHz, which is expressed by frequency [GHz]/dielectric loss (tan δ), and a dielectric constant with a temperature coefficient of −80 to +40 ppm·° $C.^{-1}$ when its constituents have an appropriate proportion.

The manufacturing process of the multilayer ceramic substrate of the multilayer ceramic module includes a firing step. The firing step simultaneously fires wiring conductors provided to the multilayer ceramic substrate.

In order to use the multilayer ceramic module at high frequencies without any problem, it is important that the wiring conductors provided on the multilayer ceramic substrate have low electrical resistances. For this reason, the wiring conductors must contain a metal with a low electrical resistance, such as copper or silver, as an electrically conductive material.

Metals such as copper and silver, however, have relatively low melting points. Accordingly, in order to prepare the multilayer ceramic substrate through the firing step in which the wiring conductors containing such a metal are simultaneously fired, the insulating ceramic composition forming the insulating ceramic layers defining the multilayer ceramic substrate must be capable of being fired at a low temperature of, for example, 1000° C. or less.

The insulating ceramic composition proposed by Patent Document 1 has disclosed firing temperatures of 1140 to 1600° C., and thus cannot satisfy the requirement that it must be capable of being fired at a temperature of 1000° C. or less.

In addition, in order to provide a multilayer ceramic substrate capable of being used for high-frequency electronic components and allowing the wiring conductors to be disposed at a high density, the insulating ceramic layers need to have a low dielectric constant. Patent Document 1 has not shown any specific value of the relative dielectric constant of the insulating ceramic sintered compact prepared by firing the disclosed insulating ceramic composition. Patent Document 1: Japanese Unexamined Patent Application Publication No. 2000-344571

DISCLOSURE OF INVENTION

Problems to be Solved by the Invention

Accordingly, an object of the present invention is to provide an insulating ceramic composition capable of being fired at a temperature of 1000° C. or less, having a low relative dielectric constant, exhibiting such superior high-frequency characteristics as the temperature dependency of the resonance frequency can be controlled to be low, and leading to a high Qf value.

Another object of the present invention is to provide an insulating ceramic sintered compact prepared by firing the insulating ceramic composition, and a monolithic ceramic electronic component using the insulating ceramic sintered compact.

Means for Solving the Problems

To overcome the above-described technical challenges, the insulating ceramic composition according to the present invention contains a first ceramic powder essentially composed of forsterite, a second ceramic powder essentially composed of at least one ceramic powder selected from the group consisting of a calcium titanate-based ceramic powder mainly containing calcium titanate, a strontium titanate-based ceramic powder mainly containing strontium titanate, and a titanium oxide-based ceramic powder mainly containing titanium oxide, and borosilicate glass powder. The borosilicate glass contains 3 to 15 percent by weight of lithium in terms of $Li_2O$, 30 to 50 percent by weight of magnesium in terms of MgO, 15 to 30 percent by weight of boron in terms of $B_2O_3$, 10 to 35 percent by weight of silicon in terms of $SiO_2$, 6 to 20 percent by weight of zinc in terms of ZnO, and 0 to 15 percent by weight of aluminum in terms of $Al_2O_3$.

Preferably, the insulating ceramic composition contains 3 to 20 percent by weight of the borosilicate glass powder.

Preferably, the first ceramic powder content is 70 percent by weight or more, and the second ceramic powder content is 6 to 30 percent by weight.

Preferably, the insulating ceramic composition further contains a third ceramic powder essentially composed of at least one ceramic powder selected from the group consisting of a copper oxide-based ceramic powder mainly containing copper oxide (CuO), an iron oxide-based ceramic powder mainly containing iron oxide ($Fe_2O_3$), and a manganese oxide-based ceramic powder mainly containing manganese oxide ($MnO_2$). In this instance, the third ceramic powder has a copper oxide-based ceramic powder content of 0.5 parts by weight or less, an iron oxide-based ceramic powder content of 1 part by weight or less, and a manganese oxide-based ceramic powder content of 2 parts by weight or less, relative to 100 parts by weight in total of the first ceramic powder, the second ceramic powder, and the borosilicate glass powder while the total third ceramic powder content is 2.5 parts by weight or less.

Preferably, the borosilicate glass has a composition from which a $Li_2(Mg, Zn)SiO_4$ crystal phase can be separated.

Preferably, the forsterite has a $MgO/SiO_2$ molar ratio in the range of 1.92 to 2.04. In this instance, the first ceramic powder preferably has an impurity content of 5 percent by weight or less, apart from the forsterite.

Preferably, the first ceramic powder has a center particle size D50 of 1 μm or less.

Preferably, the second ceramic powder contains the strontium titanate-based ceramic powder and the titanium oxide-based ceramic powder. In this instance, preferably; the strontium titanate-based ceramic powder content is 6 to 13 percent by weight and the titanium oxide-based ceramic powder content is 0.5 to 5.5 percent by weight.

If the second ceramic powder contains the strontium titanate-based ceramic powder, the strontium titanate preferably has a $SrO/TiO_2$ molar ratio in the range of 0.92 to 1.05.

In this instance, preferably, the strontium titanate-based ceramic powder contains 1 percent by weight or less of impurities apart from the strontium titanate. Also, the strontium titanate-based ceramic powder preferably has a specific surface area of 1.5 to 7.5 $m^2/g$. Furthermore, the strontium titanate-base ceramic powder preferably exhibits an X-ray diffraction pattern having a peak of the $SrTiO_3$ (222) plane with an integrated intensity of 1000 or more. The integrated intensity defines the crystallinity.

The present invention is also directed to an insulating ceramic sintered compact prepared by firing the insulating ceramic composition at a temperature of 1000° C. or less.

The present invention is also directed to a monolithic ceramic electronic component including a plurality of stacked insulating ceramic layers and wiring conductors formed in association with the insulating ceramic layers. In the monolithic ceramic electronic component, the insulating ceramic layers are formed of the insulating ceramic sintered compact, and the wiring conductors are mainly contain copper or silver.

The monolithic ceramic electronic component may further include highly dielectric ceramic layers stacked together with the insulating ceramic layers. In this instance, the highly dielectric ceramic layers preferably have a relative dielectric constant of 15 or more.

Figure 3:
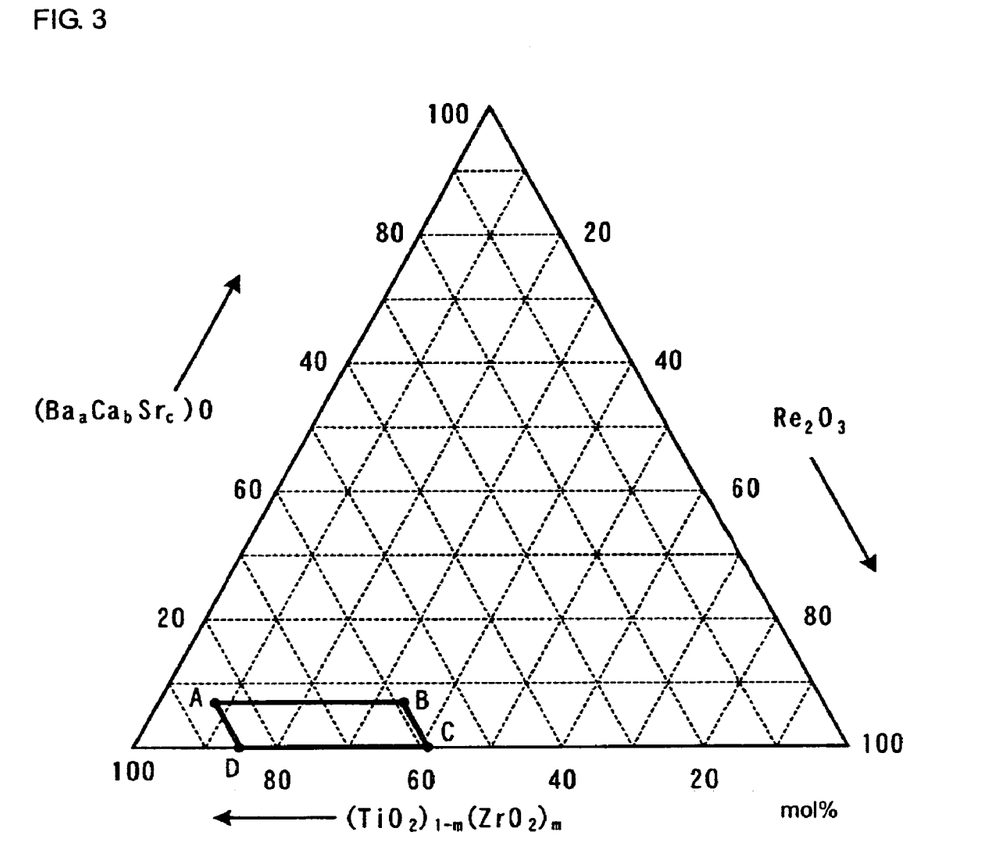
FIG. 3 is a ternary diagram showing the molar ratio (x, y, z) of $x(Ba_aCa_bSr_c)O-y\{(TiO_2)_{1-m}(ZrO_2)_m\}-zRe_2O_3$ being a preferred high dielectric constant material forming the highly dielectric ceramic layers 4 of the multilayer ceramic module 1 shown in FIG. 1.

Preferably, the highly dielectric ceramic layers are formed of the following high dielectric constant material:

For example, the high dielectric constant material contains a main constituent expressed by $x(Ba_aCa_bSr_c)O$-y$\{(TiO_2)_{1-m}(ZrO_2)_m\}$-$zRe_2O_3$ (wherein x, y, and z are in mol % and satisfy x+y+z=100; a+b+c=1, 0≦b+c<0.8, and 0≦m<0.15 hold; and Re represents at least one of rare earth elements), containing $(Ba_aCa_bSr_c)O$, $\{(TiO_2)_{1-m}(ZrO_2)_m\}$, and $Re_2O_3$ in a molar ratio (x, y, z) lying in an area surrounded by lines connecting points A(7, 85, 8), B(7, 59, 34), C(0, 59, 41), and D(0, 85, 15) in the ternary diagram shown in FIG. 3 attached (not lying on the line connecting points A and B). The high dielectric constant material also contains a first accessory constituent essentially composed of $SiO_2$-based glass and a second accessory constituent containing Mn. The highly dielectric material contains 0.1 to 25 parts by weight of the first accessory constituent and 0.5 to 20 parts by weight of the second accessory constituent in terms of Mn, relative to 100 parts by weight of the main constituent.

Preferably, this highly dielectric material further contains $Li_2O$.

Alternatively, the high dielectric constant material may contain a $BaO$—$TiO_2$—$ReO_{3/2}$-based ceramic composition expressed by $xBaO$-$yTiO_2$-$zReO_{3/2}$ (wherein x, y, and z are in mol % and satisfy x+y+z=100; 8≦x≦18, 52.5≦y≦65, and 20≦z≦40 hold; and Re represents at least one of rare earth elements), and a glass composition containing 10 to 25 percent by weight of $SiO_2$, 10 to 40 percent by weight of $B_2O_3$, 25 to 55 percent by weight of MgO, 0 to 20 percent by weight of ZnO, 0 to 15 percent by weight of $Al_2O_3$, 0.5 to 10 percent by weight of $Li_2O$, and 0 to 10 percent by weight of RO (wherein R represents at least one selected from among Ba, Sr, and Ca).

Advantages

The insulating ceramic composition of the present invention contains a first ceramic powder mainly containing forsterite, a second ceramic powder essentially composed of at least one selected from the group consisting of a calcium titanate-based ceramic powder mainly containing calcium titanate, a strontium titanate-based ceramic powder mainly containing strontium titanate, and a titanium oxide-based ceramic powder mainly containing titanium oxide, and borosilicate glass powder having a specific composition. Consequently, the insulating ceramic composition can be fired at a temperature of 1000° C. or less, as will be clear from discussion below. The insulating ceramic sintered compact obtained by the firing is chemically stable and has a comparatively low relative dielectric constant and a high Qf value. The insulating ceramic sintered compact can also achieve a resonance frequency with a stable temperature coefficient ($\tau_f$).

Accordingly, a monolithic ceramic electronic component made of the insulating ceramic sintered compact of the present invention allows the use of copper- or silver-based wiring conductors in the electronic component, and thus can be suitably used at high frequencies.

In the insulating ceramic composition of the present invention, the borosilicate glass content can be reduced to 20 percent by weight or less. Since borosilicate glass is relatively expensive, the reduction of the borosilicate glass powder content is advantageous in terms of cost. The reduction of the borosilicate glass powder content also makes it easy to control the reaction between the second ceramic powder acting as an additive and the glass and to control the $\tau_f$ value with the additive.

The insulating ceramic composition further containing a third ceramic powder essentially composed of at least one ceramic powder selected from the group consisting of a copper oxide-based ceramic powder mainly containing (CuO), an iron oxide-based ceramic powder mainly containing iron oxide ($Fe_2O_3$), and a manganese oxide-based ceramic powder mainly containing manganese oxide ($MnO_2$) in the above-described proportion can certainly achieve a Qf value of 10000 GHz or more and a resonance frequency with a temperature coefficient ($\tau_f$) within ±30 ppm·° $C.^{-1}$.

If the monolithic ceramic electronic component of the present invention further includes highly dielectric ceramic layers stacked together with the insulating ceramic layers, having a relative dielectric constant of 15 or more, the monolithic ceramic electronic component can offer high performance and can be small.

The highly dielectric ceramic layers formed of either of the above-described high dielectric constant materials allow the thermal expansion coefficients between the insulating ceramic layers and the highly dielectric ceramic layers to be close. The insulating ceramic layers and highly dielectric ceramic layers can maintain a good state of their joining without producing relatively large stress after firing.

If the former of the above-described high dielectric constant materials further contains $Li_2O$, the composition of the material of the highly dielectric ceramic layers can be similar to that of the insulating ceramic layers because the insulating ceramic layers contain lithium as well. Consequently, unnecessary reaction can be prevented in the firing step. The addition of $Li_2O$ to the highly dielectric ceramic layers reduces the softening point of glass, so that even a small amount of glass can enhance the degree of sintering. Consequently, the relative dielectric constant can further be increased.

The latter high dielectric constant material exhibits high Q value particularly at high frequencies, and facilitates control of the resonance frequency temperature coefficient ($\in_{Tf}$). Accordingly, combined use of the highly dielectric ceramic layers made of the high dielectric constant material and the insulating ceramic layers made of the insulating ceramic composition of the present invention can advantageously achieve electronic components functioning as resonators and filters in a high frequency band.

REFERENCE NUMERALS

1: multilayer ceramic module
2: multilayer ceramic substrate
3: insulating ceramic layer
4: highly dielectric ceramic layer
6: internal conductor film
7, 43, 45, 46, 50, 52, 56, 57, 59: via hole conductor
8: external conductor film
21: LC FILTER
23: component body
24-27: terminal electrode
28-40: ceramic green sheet
41, 44, 58, 60: coil pattern
42, 48, 49, 54, 55, 61: extraction pattern
47, 51, 53: capacitor pattern

BEST MODE FOR CARRYING OUT THE INVENTION

The insulating ceramic composition according to the present invention contains a first ceramic powder mainly containing forsterite ($Mg_2SiO_4$), a second ceramic powder acting as an additive, essentially composed of at least one selected from the group consisting of a calcium titanate ($CaTiO_3$)-based ceramic powder, a strontium titanate ($SrTiO_3$)-based ceramic powder, and a titanium oxide ($TiO_2$)-based ceramic powder, and a borosilicate glass powder. In particular, the composition of the borosilicate glass is featured.

The borosilicate glass contains 3 to 15 percent by weight of lithium in terms of $Li_2O$, 30 to 50 percent by weight of magnesium in terms of MgO, 15 to 30 percent by weight of boron in terms of $B_2O_3$, 10 to 35 percent by weight of silicon in terms of $SiO_2$, 6 to 20 percent by weight of zinc in terms of ZnO, and 0 to 15 percent by weight of aluminum in terms of $Al_2O_3$. In particular, it is preferable that the borosilicate glass have a composition from which a $Li_2(Mg, Zn)SiO_4$ crystal phase can be separated, from the viewpoint of achieving a sintered compact exhibiting a higher Q value and higher reliability (moisture resistance).

The lithium contained in the borosilicate glass, which acts as a constituent of the $Li_2(Mg, Zn)SiO_4$, reduces the sintering temperature of the insulating ceramic composition. The lithium content in terms of $Li_2O$ in the borosilicate glass is limited to the range of 3 to 15 percent by weight. If the lithium content is less than 3 percent by weight, the density cannot be increased at 1000° C. or less, the $Li_2(Mg, Zn)SiO_4$ crystal phase cannot be separated from the sintered compact, and the Q value decreases. If the lithium content is more than 15 percent by weight, the $Li_2(Mg, Zn)SiO_4$ crystal phase cannot be separated from the sintered compact, the Q value decreases, and further the chemical stability deteriorates. Preferably, the lithium content is 4 to 10 percent by weight in terms of $Li_2O$. This increases the Q value of the sintered compact.

The magnesium contained in the borosilicate glass, which acts as a constituent of the $Li_2(Mg, Zn)SiO_4$ crystal phase, allows the temperature for melting glass to be reduced. The magnesium content in terms of MgO in the borosilicate glass is limited to the range of 30 to 50 percent by weight. If the magnesium content is less than 30 percent by weight, the $Li_2(Mg, Zn)SiO_4$ crystal phase cannot be separated from the sintered compact and the Q value decreases. If the magnesium content is more than 50 percent by weight, vitrification is difficult or impossible. Preferably, the magnesium content is 30 to 45 percent by weight in terms of MgO. This increases the Q value of the sintered compact.

The boron content in terms of $B_2O_3$ in the borosilicate glass is limited to the range of 15 to 30 percent by weight. A boron content of less than 15 percent by weight increases the melting point of the glass. On the other hand, a boron content of more than 30 percent by weight reduces the moisture resistance, the crystallinity, and the Q value of the sintered compact. Preferably, the boron content is 15 to 25 percent by weight in terms of $B_2O_3$. This increases the Q value of the sintered compact and reduces the reactivity with $CaTiO_3$, $SrTiO_3$, and $TiO_2$.

The silicon contained in the borosilicate glass acts as a constituent of the $Li_2(Mg, Zn)SiO_4$ crystal phase. The silicon content in terms of $SiO_2$ in the borosilicate glass is limited to the range of 10 to 35 percent by weight. A silicon content of less than 10 percent by weight results in a chemically unstable sintered compact, and the sintered compact may not be vitrified. In contrast, if the silicon content is more than 35 percent by weight, the $Li_2(Mg, Zn)SiO_4$ crystal phase cannot be separated from the sintered compact, and the Q value decreases. Preferably, the silicon content is 15 to 30 percent by weight in terms of $SiO_2$. This increases the Q value of the sintered compact.

The zinc contained in the borosilicate glass, which acts as a constituent of the $Li_2(Mg, Zn)SiO_4$ crystal phase, increases the Q value of the sintered compact. In the borosilicate glass, the zinc content in terms of ZnO is limited to the range of 6 to 20 percent by weight. If the zinc content is less than 6 percent by weight, the zinc does not form $Li_2(Mg, Zn)SiO_4$ in the sintered compact, and the Q value and the chemical stability are degraded. On the other hand, a zinc content of more than 20 percent by weight reduces the chemical stability of the sintered compact.

Although the borosilicate glass may not contain aluminum, the presence of 15 percent or less by weight of aluminium in terms of $Al_2O_3$ can enhance the chemical stability of the sintered compact. In the composition of the present invention, $Al_2O_3$ serves as a network-forming oxide in the glass to prevent the devitrification of the glass. The devitrification means that glass is crystallized while being prepared. The use of partially crystallized glass increases the variations in electrical properties and degree of sintering. If the aluminum content in terms of $Al_2O_3$ is more than 15 percent by weight, the density cannot be increased at 1000° C. or less, and the crystallinity and the Q value of the sintered compact are reduced. Preferably, the aluminum content is 10 percent by weight or less in terms of $Al_2O_3$.

In the insulating ceramic composition of the present invention, the borosilicate glass powder content is preferably 3 to 20 percent by weight.

The reason why the preferred borosilicate glass powder content is 3 percent by weight or more is that a content of less than 3 percent by weight may not increase the density at 1000° C. or less. The reason why the preferred borosilicate glass powder content is 20 percent by weight or less is that a content of more than 20 percent by weight increases the amount of expensive glass, and is consequently disadvantage in cost. In addition, if the glass content is increased, the percentage of the crystal phase tends to relatively decrease, and consequently the Q value of the resulting sintered compact may be reduced.

In other words, it is preferable that the borosilicate glass powder content be as small as possible, as long as being 3 percent by weight or more. For example, it can be 15 percent by weight or less, which is in the range of 20 percent by weight or less. The decrease of the borosilicate glass powder content makes it easy to control the reaction between the second ceramic powder acting as an additive and the glass, so that the additive can easily control the temperature dependency of the resonance frequency.

Preferably, the insulating ceramic composition contains at least 70 percent by weight of the first ceramic powder and 6 to 30 percent by weight of the second ceramic powder. Forsterite being the main constituent of the first ceramic has a $\tau_f$ value of −60 ppm/° C. $CaTiO_3$ being the main constituent of the second ceramic has a $\tau_f$ value of +800 ppm/° C., $SrTiO_3$ has a $\tau_f$ value of +1700 ppm/° C., and $TiO_2$ has a $\tau_f$ value of +450 ppm/° C. The borosilicate glass has a negative $\tau_f$ value. The above-described composition is preferable in order to ensure a $\tau_f$ value of ±30 ppm/° C. or less.

Preferably, the forsterite, or the main constituent of the first ceramic powder, has a $MgO/SiO_2$ molar ratio of 1.92 to 2.04. A $MgO/SiO_2$ ratio outside the range of 1.92 to 2.04 may result in a sintered compact with degraded chemical stability. The first ceramic powder is mainly formed of the crystal phase of forsterite ($Mg_2SiO_4$). No other crystal phases may be contained, or at least one crystal phase selected from the group consisting of $SiO_2$ (quartz), MgO, and $MgSiO_3$ (steatite) may be contained in a very small amount.

The first ceramic powder may contain 5 percent by weight or less of impurities other than forsterite. An impurity content of more than 5 percent by weight decreases the Q value of the sintered compact, and may further degrade the chemical stability. The impurities include $Al_2O_3$, $B_2O_3$, CaO, $Fe_2O_3$, $MnO_2$, NiO, $SnO_2$, SrO, ZnO, $P_2O_5$, $TiO_2$, $ZrO_2$, $Li_2O$, $Na_2O$, and $K_2O$.

Preferably, the first ceramic powder has a center particle size D50 of 1 μm or less. If the center particle size D50 is more than 1 μm, the density may not be increased when the borosilicate glass powder content is 3 to 20 percent by weight.

The second ceramic powder acting as an additive can control the temperature dependency of the resonance frequency of the sintered compact.

For a second ceramic powder containing the $CaTiO_3$-based ceramic powder, the $CaTiO_3$ content is preferably 15 percent by weight or less. A content of more than 15 percent by weight may reduce the Q value of the sintered compact, and, in addition, increases the relative dielectric constant to negatively affect the transmission speed in high-frequency bands.

For a second ceramic powder containing $SrTiO_3$-based ceramic powder, the $SrTiO_3$ content is preferably 13 percent by weight or less. A content of more than 13 percent by weight may reduce the Q value of the sintered compact, and, in addition, increases the relative dielectric constant to negatively affect the transmission speed in high-frequency bands.

The $TiO_2$-based ceramic powder enhances the crystallinity. In order to exert this effect, the $TiO_2$ content is preferably 0.3 percent by weight or more. A content of more than 30 percent by weight however increases the relative dielectric constant of the sintered compact to negatively affect the transmission speed in high-frequency bands. Hence, the preferred $TiO_2$-based ceramic powder content is 30 percent by weight or less.

A second ceramic powder containing the $SrTiO_3$-based ceramic powder and the $TiO_2$-based ceramic powder not only produces the same effect as $SrTiO_3$ or $TiO_2$ controls the temperature dependency of the resonance frequency, but also leads to a lower relative dielectric constant for the same $\tau_f$ value than the case where $CaTiO_3$ or $TiO_2$ is used. $TiO_2$ highly contributes to the promotion of crystallization of the glass (that is, the increase of the Q value and the moisture resistance of the sintered compact).

In the use of the second ceramic powder containing $SrTiO_3$ and $TiO_2$, preferably, the $SrTiO_3$-based ceramic powder content is 6 to 13 percent by weight and the $TiO_2$-based ceramic powder content is 0.3 to 5.5 percent by weight, relative to the entirety of the insulating ceramic composition, from the viewpoint of reducing the dielectric constant of the sintered compact and promoting the crystallization of the glass without degrading other characteristics.

If the $SrTiO_3$-based ceramic powder content is less than 6 percent by weight, the temperature coefficient of the resonance frequency of the sintered compact tends to decrease to the large negative side. On the other hand, if the $SrTiO_3$-based ceramic powder content is more than 13 percent by weight, the Q value of the sintered compact tends to decrease. If the $TiO_2$-based ceramic powder content is less than 0.3 percent by weight, the crystal phase tends to become difficult to separate out. On the other hand, if the $TiO_2$ based ceramic powder content is more than 5.5 percent by weight, the temperature coefficient of the resonance frequency of the sintered compact tends to increase to the large positive side.

If the second ceramic powder contains the strontium titanate-based ceramic powder, the strontium titanate preferably has a $SrO/TiO_2$ molar ratio of 0.92 to 1.05.

A $SrO/TiO_2$ ratio of more than 1.05 may allow unreacted SrO to remain in a form of carbonate and, consequently, reduce the Q factor, or the SrO may react with a constituent of the glass to reduce the moisture resistance. $Sr_2TiO_4$ or other crystal phases may be separated out. If $Sr_2TiO_4$ or the like is separated out, the $SrTiO_3$ content may be increased so as to adjust the resonance frequency temperature coefficient ($\in_{Tf}$) in the entire system, because $Sr_2TiO_4$ or the like has a lower $\in_{Tf}$ absolute value than $SrTiO_3$. Consequently, the Q value may be reduced.

If the $SrO/TiO_2$ ratio is less than 0.92, $SrTiO_3$ or $TiO_2$ may be separated out. Since in the present invention, $TiO_2$ may be additionally mixed, there occurs no problem with electrical characteristics, as long as the $SrTiO_3$ and $TiO_2$ contents are appropriately adjusted. Adjusting the $SrTiO_3$ and $TiO_2$ contents on an as-needed basis makes process control complicated and increases cost.

In this instance, the strontium titanate-based ceramic powder preferably contains i percent by weight or less of impurities apart from the strontium titanate. The impurities may be those originally contained in the raw material or mixed during the manufacture process. Exemplary impurities include $Nb_2O_5$, $Fe_2O_3$, and $Na_2O$. These impurities in a content of more than 1 percent by weight, singly or in total, may reduce the Q value.

Preferably, the strontium titanate-based ceramic powder has a specific surface area of 1.5 to 7.5 $m^2/g$. A specific surface area of less than 1.5 $m^2/g$ may make it difficult to sinter the ceramic composition, and in contrast, a specific surface area of more than 7.5 $m^2/g$ may make the reactivity with glass high and reduce the Q value.

Preferably, the strontium titanate-based ceramic powder exhibits an X-ray diffraction pattern having a peak of the $SrTiO_3$ (222) plane with an integrated intensity of 1000 or more. If the integrated intensity is less than 1000, the crystallinity of $SrTiO_3$ is not much high, the reactivity with glass is enhanced, and the Q value may be reduced.

The above-described insulating ceramic composition can be fired at a temperature of 1000° C. or less, and the resulting insulating ceramic sintered compact can be advantageously used for monolithic ceramic electronic components.

The insulating ceramic composition of the present invention may further contain a third ceramic powder in addition to the above-described first and second ceramic powders and borosilicate glass powder. The third ceramic powder is essentially composed of at least one ceramic powder selected from the group consisting of a copper oxide-based ceramic powder mainly containing copper oxide (CuO), an iron oxide-based ceramic powder mainly containing iron oxide ($Fe_2O_3$), and a manganese oxide-based ceramic powder mainly containing manganese oxide ($MnO_2$). In this instance, the third ceramic powder has a copper oxide-based ceramic powder content of 0.5 parts by weight or less, an iron oxide-based ceramic powder content of 1 part by weight or less, and a manganese oxide-based ceramic powder content of 2 parts by weight or less, relative to 100 parts by weight in total of the first ceramic powder, the second ceramic powder, and the borosilicate glass powder while the total third ceramic powder content is 2.5 parts by weight or less.

The insulating ceramic composition containing the third ceramic powder, as above, can achieve a sufficiently sintered insulating ceramic compact even if the borosilicate glass powder content is reduced. Accordingly, the first ceramic powder content can be relatively increased. Consequently, a Qf value of 10000 GHz or more can be ensured, and a resonance frequency with a temperature coefficient ($\tau_f$) within ±30 ppm·° $C.^{-1}$ can be ensured.

Figure 1:
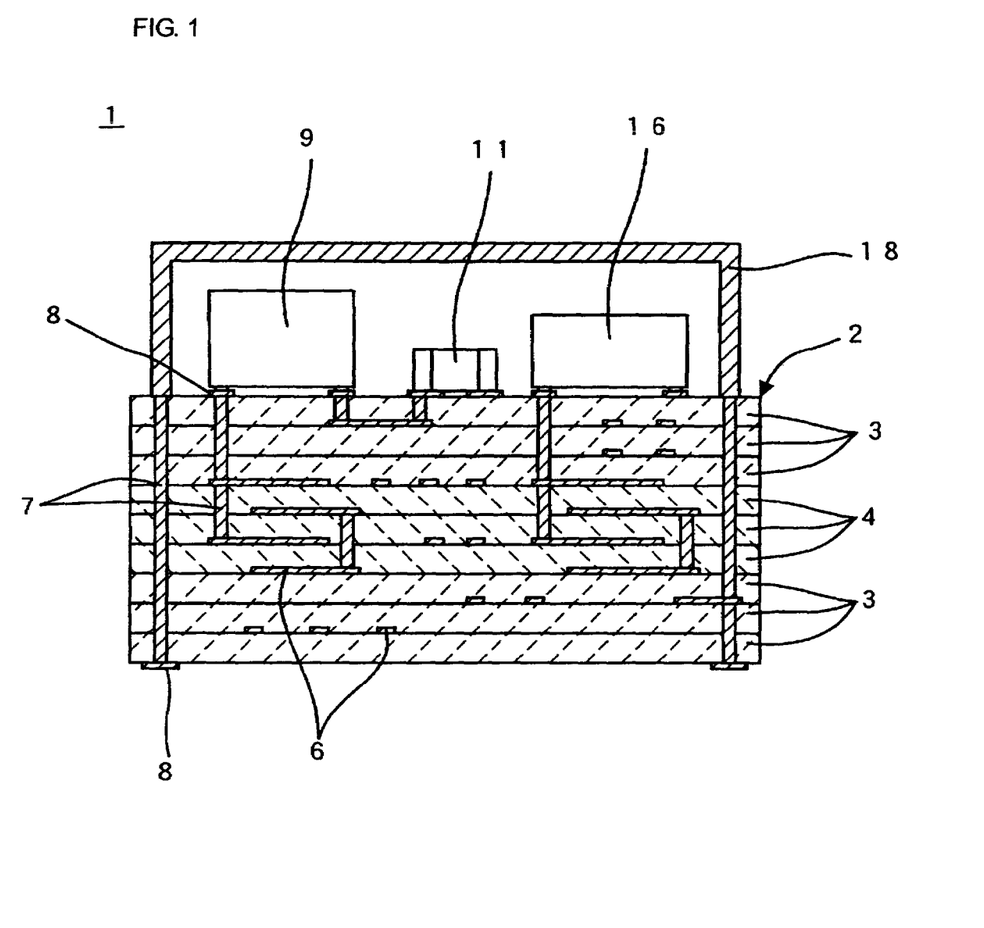
FIG. 1 is a sectional view of a multilayer ceramic module 1 according to an embodiment of monolithic ceramic electronic components using an insulating ceramic composition of the present invention.
Figure 2:
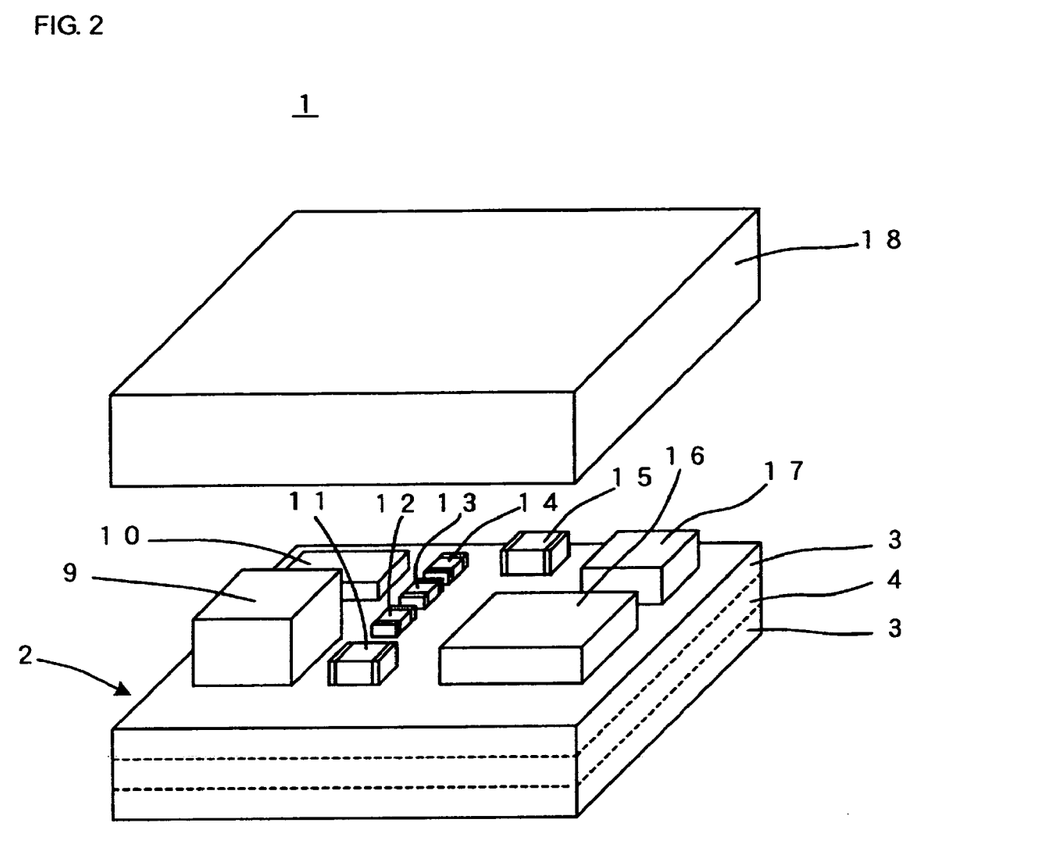
FIG. 2 is an exploded perspective view of the multilayer ceramic module 1 shown in FIG. 1.

FIG. 1 is a sectional view of a multilayer ceramic module 1 according to an embodiment of the monolithic ceramic electronic components using the insulating ceramic composition of the present invention. FIG. 2 is an exploded perspective view of the multilayer ceramic module 1 shown in FIG. 1.

The multilayer ceramic module 1 includes a multilayer ceramic substrate 2. The multilayer ceramic substrate 2 includes a plurality of stacked insulating ceramic layers 3 and a plurality of stacked highly dielectric ceramic layers 4. The plurality of insulating ceramic layers 3 are separated from one another by the respective highly dielectric ceramic layers 4.

The insulating ceramic layer 3 are made of an insulating ceramic sintered compact prepared by firing the insulating ceramic composition, and have a comparatively low relative dielectric constant of, for example, 10 or less.

The highly dielectric ceramic layers 4 have a composition containing, for example, barium titanate and glass, and have a relative dielectric constant of 15 or more, preferably 30 or more.

The multilayer ceramic substrate 2 includes various types of wiring conductors. The wiring conductors typically include internal conductor films 6 provided along some interfaces between the ceramic layers 3 and 4, via hole conductors 7 extending through some of the ceramic layers 3 and 4, and external conductor films 8 provided on the external surfaces of the multilayer ceramic substrate 2.

Some of the internal conductor films 6 associated with the highly dielectric ceramic layers 4 are disposed so as to provide capacitance, thus defining capacitor elements.

A plurality of electronic components 9 to 17 are disposed on the upper surface of the multilayer ceramic substrate 2. Among the electronic components 9 to 17 shown in the figure, for example, the electronic component 9 is a diode, the electronic component 11 is a monolithic ceramic capacitor, and the electronic component 16 is a semiconductor IC. The electronic components 9 to 17 are each electrically connected to some of the external conductor films 8 formed on the upper surface of the multilayer ceramic substrate 2, so that the electronic components and the wiring conductors formed in the multilayer ceramic substrate 2 constitute a necessary circuit for the multilayer ceramic module 1.

A conductive cap 18 for shielding the electronic components 9 to 17 is fixed to the upper surface of the multilayer ceramic substrate 2. The conductive cap 18 is electrically connected to some of the via hole conductors 7.

The multilayer ceramic module 1 is mounted on a mother board not shown in the figure, using some of the external conductor films 8 formed on the lower surface of the multilayer ceramic substrate 2 as connecting terminals.

The multilayer ceramic module 1 can be produced by a known technique for firing monolithic multilayer ceramics.

First, ceramic green sheets are formed for the insulating ceramic layers 3. More specifically, an organic vehicle containing a binder resin and a solvent is added to the insulating ceramic composition (that is, raw material composition) of the present invention to prepare a ceramic slurry. The ceramic slurry is formed into a sheet by the doctor blade method. After being dried, the sheet is stamped into pieces with a predetermined size, thereby forming the ceramic green sheets. Then, a copper- or silver-based conductive paste is applied to form predetermined patterns on the ceramic green sheets, and thus the wiring conductors are formed.

On the other hand, ceramic green sheets containing a highly dielectric ceramic composition are formed for the highly dielectric ceramic layers 4. For example, any one of the following (1) to (4) can be prepared as the highly dielectric ceramic composition:

(1) A highly dielectric ceramic composition containing: a main constituent expressed by $x(Ba_aCa_bSr_c)O$-$y\{(TiO_2)_{1-m}(ZrO_2)_m\}$-$zRe_2O_3$ as disclosed in Japanese Unexamined Patent Application Publication No. 2001-80959 (wherein x, y, and z are in mol % and satisfy x+y+z=100; a+b+c=1, $0 \leq b+c < 0.8$, and $0 \leq m < 0.15$ hold; and Re represents at least one of rare earth elements), containing $(Ba_aCa_bSr_c)O$, $\{(TiO_2)_{1-m}(ZrO_2)_m\}$, and $Re_2O_3$ in a molar ratio (x, y, z) lying in an area surrounded by lines connecting points A(7, 85, 8), B(7, 59, 34), C(0, 59, 41), and D(0, 85, 15) in the ternary diagram shown in FIG. 3 attached (not lying on the line connecting points A and B); a first accessory constituent essentially composed of $SiO_2$-based glass; and a second accessory constituent containing Mn, wherein the highly dielectric material contains 0.1 to 25 parts by weight of the first accessory constituent and 0.5 to 20 parts by weight of the second accessory constituent in terms of Mn, relative to 100 parts by weight of the main constituent.

(2) A highly dielectric ceramic composition containing: a $BaO$—$TiO_2$—$ReO_{3/2}$-based ceramic composition expressed by $xBaO$—$yTiO_2$—$zReO_{3/2}$ as disclosed in Japanese Unexamined Patent Application Publication No. 2002-97072 (wherein x, y, and z are in mol % and satisfy x+y+z=100; $8 \leq x \leq 18$, $52.5 \leq y \leq 65$, and $20 \leq z \leq 40$ hold; and Re represents at least one of rare earth elements); and a glass composition containing 10 to 25 percent by weight of $SiO_2$, 10 to 40 percent by weight of $B_2O_3$, 25 to 55 percent by weight of MgO, 0 to 20 percent by weight of ZnO, 0 to 15 percent by weight of $Al_2O_3$, 0.5 to 10 percent by weight of $Li_2O$, and 0 to 10 percent by weight of RO (wherein R represents at least one selected from among Ba, Sr, and Ca).

(3) A highly dielectric ceramic composition essentially composed of: a $BaO$—$TiO_2$—$ReO_{3/2}$—$BiO_3$-based ceramic powder as disclosed in Japanese Unexamined Patent Application Publication No. 11-310455 (wherein Re represents a rare earth element); and a glass powder containing 13 to 50 percent by weight of $SiO_2$, 3 to 30 percent by weight of $B_2O_3$, 40 to 80 percent by weight of alkaline-earth metal oxide, and 0.1 to 10 percent by weight of $Li_2O$.

(4) A highly dielectric ceramic composition essentially composed of: a $BaO$—$TiO_2$—$ReO_{3/2}$-based ceramic powder as disclosed in Japanese Unexamined Patent Application Publication No. 11-228222 (wherein Re represents a rare earth element); and a glass powder containing 13 to 50 percent by weight of $SiO_2$, 3 to 30 percent by weight of $B_2O_3$, 40 to 80 percent by weight of alkaline-earth metal oxide, and 0.5 to 10 percent by weight of $Li_2O$.

Preferably, the highly dielectric ceramic composition of (1) further contains $Li_2O$.

Then, an organic vehicle containing a binder resin and a solvent is added to the highly dielectric ceramic composition selected from among the above (1) to (4) to prepare a ceramic slurry. The ceramic slurry is formed into a sheet by the doctor blade method. After being dried, the sheet is stamped into pieces with a predetermined size, thereby forming the ceramic green sheets. Then, a copper- or silver-based conductive paste is applied to form predetermined patterns on the ceramic green sheets, and thus the wiring conductors are formed.

Then, predetermined numbers of the insulating ceramic green sheets and the highly dielectric ceramic green sheets are stacked in a predetermined order, and are subsequently pressed in the thickness direction.

The resulting green composite is fired at a temperature of 1000° C. or less, for example, 800 to 1000° C., to complete the multilayer ceramic substrate 2. If the wiring conductors mainly contain copper, the firing is performed in a non-oxidizing atmosphere, such as in a nitrogen atmosphere; if the wiring conductors mainly contain silver, the firing is performed in an oxidizing atmosphere, such as in air.

Then, the electronic components 9 to 17 are disposed on the surface of the multilayer ceramic substrate 2 by soldering or the like, and the conductive cap 18 is fixed. Thus, the multilayer ceramic module 1 is completed.

In the multilayer ceramic module 1, the insulating ceramic layers 3 of the multilayer ceramic substrate 2 are formed of the insulating ceramic composition of the present invention, and the wiring conductors 6 to 8 are formed of a metal with a low specific resistance, such as copper or silver. Therefore, the insulating ceramic layers 3 have a low relative dielectric constant, a resonance frequency with superior temperature characteristics, and a high Q value. Thus, the resulting multilayer ceramic module 1 can be suitably used at high frequencies and be highly reliable.

Figure 4:
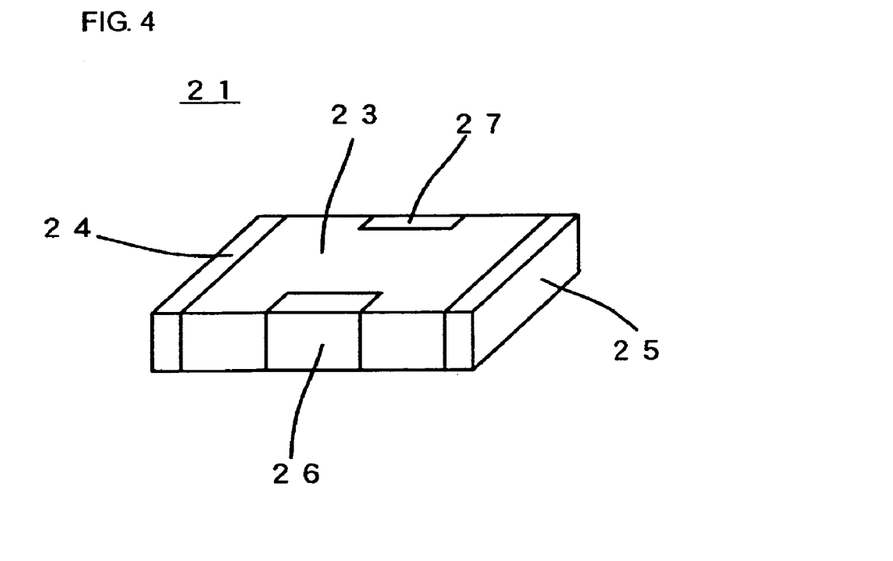
FIG. 4 is a perspective view of the appearance of an LC filter 21 according to another embodiment of the monolithic ceramic electronic components using the insulating ceramic composition of the present invention.
Figure 5:
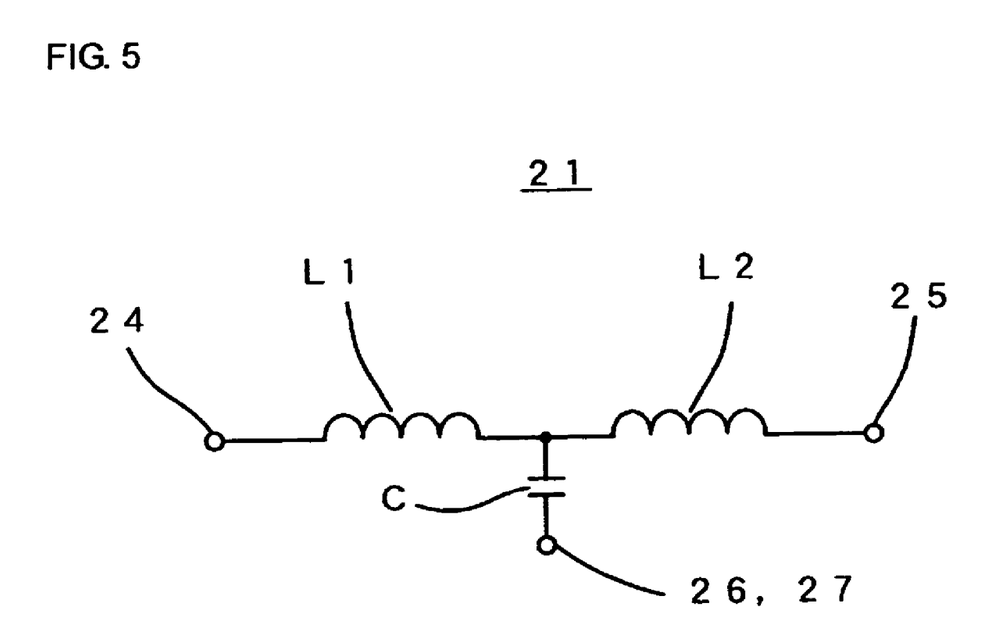
FIG. 5 is an equivalent circuit of the LC filter 21 shown in FIG. 4.
Figure 6:
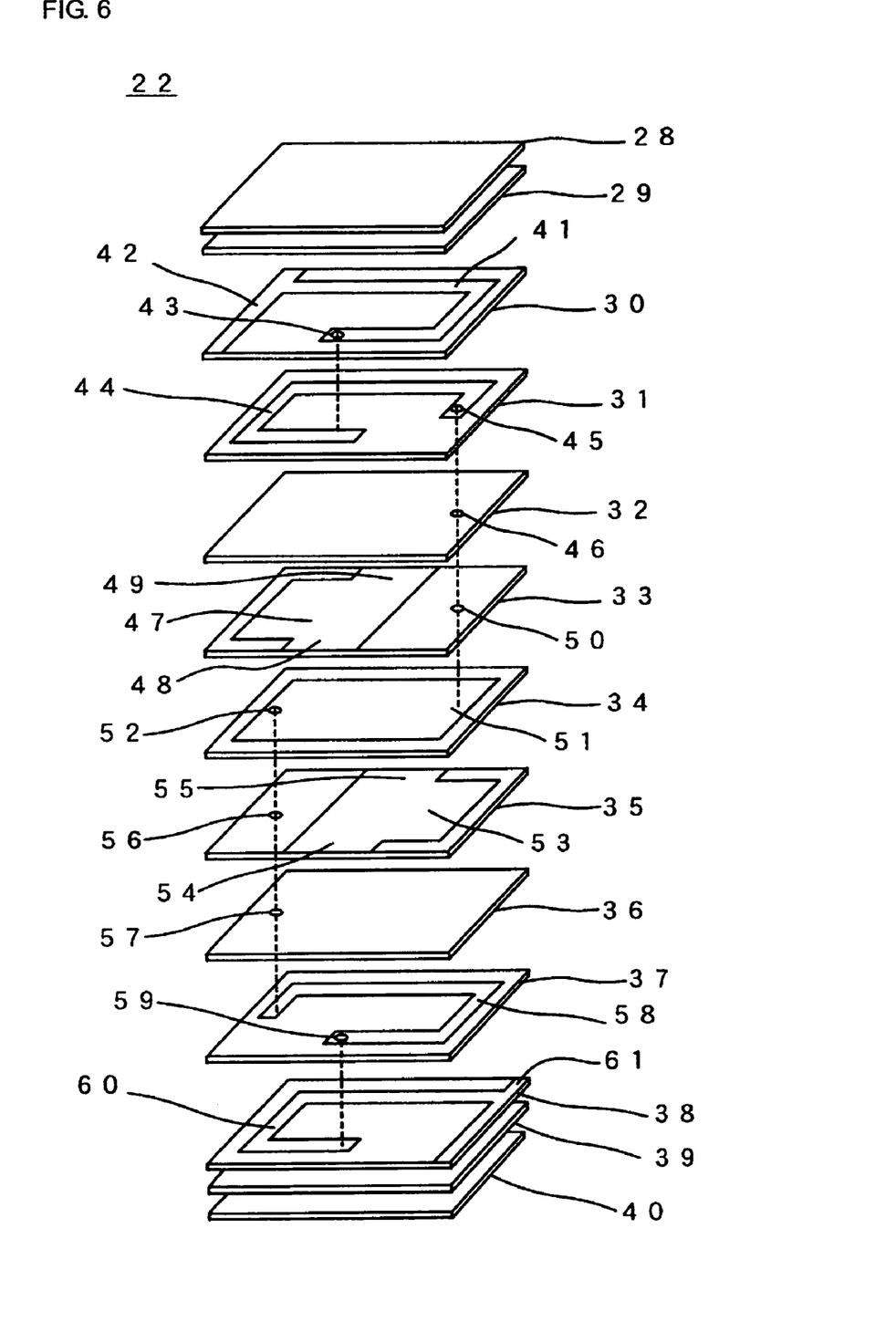
FIG. 6 is an exploded perspective view of a green composite 22 being an intermediate that is to be subjected to a firing step in the manufacture process of the LC filter 21 shown in FIG. 4.

FIGS. 4 to 6 show an LC filter 21 according to another embodiment of the monolithic ceramic electronic components using the insulating ceramic composition of the present invention. FIG. 4 is a perspective view of the appearance of the LC filter 21; FIG. 5 is an equivalent circuit of the LC filter 21; and FIG. 6 is an exploded perspective view of a green composite 22 being an intermediate that is to be subjected to a firing step in the manufacture process of the LC filter.

As shown in FIG. 4, the LC filter 21 includes a component body 23 being a multilayer composite constituted of a plurality of stacked insulating ceramic layers. The component body 23 is provided with terminal electrodes 24 and 25 at its ends on the external surfaces, and with terminal electrodes 26 and 27 in the middles of the side surfaces.

As shown in FIG. 5, the LC filter 21 includes two inductance coils L1 and L2 connected between the terminal electrodes 24 and 25 in series and a capacitor C between the contact of the inductance coils L1 and L2 and the terminal electrodes 26 and 27.

Turning to FIG. 6, the green composite 22, which is turned into the component body 23 by firing, includes a plurality of stacked ceramic green sheets 28 to 40. The number of the ceramic green sheets is not limited to the number shown in the figure.

The ceramic green sheets 28 to 40 are each formed by forming a ceramic slurry being a mixture of the insulating ceramic composition of the present invention and an organic vehicle containing a binder resin and a solvent into a sheet by the doctor blade method, subsequently drying the sheet, and stamping the sheet into pieces with a predetermined size.

In order to form the inductance coils L1 and L2 and the capacitor C as shown in FIG. 5, wiring conductors are formed in association with some of the ceramic green sheets 28 to 40 in the manner described below.

The ceramic green sheet 30 has a coil pattern 41 defining part of the inductance coil L1 and an extraction pattern 42 extending from an end of the coil pattern 41. The other end of the coil pattern 41 is provided with a via hole conductor 43.

The ceramic green sheet 31 has a coil pattern 44 defining part of the inductance coil L1. An end of the coil pattern 44 is provided with a via hole conductor 45, and the other end is connected to the foregoing via hole conductor 43.

The ceramic green sheet 32 has a via hole conductor 46 connected to the foregoing via hole conductor 45.

The ceramic green sheet 33 has a capacitor pattern 47 defining part of the capacitor C and extraction patterns 48 and 49 extending from the capacitor pattern 47. The ceramic green sheet 33 also has a via hole conductor 50 connected to the foregoing via hole conductor 46.

The ceramic green sheet 34 has a capacitor pattern 51 defining part of the capacitor C and a via hole conductor 52 connected to the capacitor pattern 51. The capacitor pattern 51 is connected to the foregoing via hole conductor 50.

The ceramic green sheet 35 has a capacitor pattern 53 defining part of the capacitor C and extraction patterns 54 and 55 extending from the capacitor pattern 53. The ceramic green sheet 35 is provided with a via hole conductor 56 connected to the foregoing via hole conductor 52.

The ceramic green sheet 36 has a via hole conductor 57 connected to the foregoing via hole conductor 56.

The ceramic green sheet 37 has a coil pattern 58 defining part of the inductance coil L2. An end of the coil pattern 58 is provided with a via hole conductor 59, and the other end is connected to the foregoing via hole conductor 57.

The ceramic green sheet 38 has a coil pattern 60 defining part of the inductance coil L2 and an extraction pattern 61 extending from an end of the coil pattern 60. The other end of the coil pattern 60 is connected to the foregoing via hole conductor 59.

In order to form these wiring conductors, that is, coil patterns 41, 44, 58, and 60, the extraction patterns 42, 48, 49, 54, 55, and 61, the via hole conductors 43, 45, 46, 50, 52, 56, 57, and 59, and the capacitor patterns 47, 51, and 53, a copper- or silver-based conductive paste is used, and the conductive paste is applied by, for example, screen printing.

The green composite 22 is formed by stacking the ceramic green sheets 28 to 40 in the order shown in FIG. 6, and pressing the layers in the thickness direction.

The green composite 22 is fired at a temperature of 1000° C. or less, for example, 800 to 1000° C., thus preparing the component body 23 shown in FIG. 4. As described in the case of firing the multilayer ceramic module 1, the firing is performed in a non-oxidizing atmosphere, such as in a nitrogen atmosphere, if the wiring conductor mainly contains copper, or in an oxidizing atmosphere, such as in air, if the wiring conductor mainly contains silver.

Then, the terminal electrodes 24 to 27 are formed on the external surfaces of the component body 23. The formation of the terminal electrodes 24 to 27 are performed by, for example, applying and baking a copper- or silver-based conductive paste, or a thin-film forming technique, such as vapor deposition, plating, or sputtering.

Thus, the LC filter 21 is produced.

In the above description, the ceramic green sheets 28 to 40 are made of the insulating ceramic composition of the present invention. However, the specific ceramic green sheets 33 and 34 involved in the formation of the capacitor C, among the ceramic green sheets 28 to 40 are preferably made of the highly dielectric ceramic composition for the high dielectric constant material forming the highly dielectric ceramic layers 4 in the multilayer ceramic module 1 shown in FIG. 1.

The monolithic ceramic electronic component using the insulating ceramic composition of the present invention is not limited to the multilayer ceramic module 1 or the LC filter 21 shown in the figures. The insulating ceramic composition of the present invention can be applied to, for example, multilayer ceramic substrates, such as for multichip modules and hybrid ICs, various types of complex electronic components having electronic components on the multilayer ceramic substrates, and chip-type monolithic electronic components, such as chip-type monolithic capacitors and chip-type monolithic dielectric antennas.

Experimental examples will now be described for examining the characteristics of the insulating ceramic composition of the present invention, and for determining the scope or preferred scope of the present invention for the insulating ceramic composition.

EXPERIMENTAL EXAMPLE 1

First, various types of composition shown in Table 1 were prepared for use as the borosilicate glass powder contained in the insulating ceramic composition.

TABLE 1

| Glass code | $Li_2O$ (wt %) | MgO (wt %) | $B_2O_3$ (wt %) | $SiO_2$ (wt %) | ZnO (wt %) | $Al_2O_3$ (wt %) | Remarks |
|---|---|---|---|---|---|---|---|
| * G1 | 2.0 | 38.0 | 25.0 | 27.0 | 8.0 | — | |
| G2 | 3.5 | 38.0 | 25.0 | 25.5 | 8.0 | — | |
| G3 | 15.0 | 32.0 | 20.0 | 23.0 | 10.0 | — | |
| * G4 | 16.5 | 32.0 | 20.0 | 21.5 | 10.0 | — | |
| * G5 | 6.0 | 28.0 | 26.0 | 28.0 | 8.0 | 4.0 | |
| G6 | 6.0 | 30.0 | 26.0 | 28.0 | 8.0 | 4.0 | |
| G7 | 5.0 | 49.0 | 22.0 | 18.0 | 6.0 | — | |
| * G8 | 5.0 | 55.0 | 19.0 | 15.0 | 6.0 | — | Vitrification impossible |
| * G9 | 8.0 | 44.0 | 14.0 | 25.0 | 7.0 | 2.0 | Vitrification difficult |
| G10 | 8.0 | 42.0 | 16.0 | 25.0 | 7.0 | 2.0 | |
| G11 | 6.0 | 34.0 | 29.0 | 21.0 | 10.0 | — | |
| * G12 | 6.0 | 33.0 | 31.0 | 20.0 | 10.0 | — | |
| * G13 | 10.0 | 38.0 | 23.0 | 9.0 | 10.0 | 10.0 | Vitrification impossible |
| G14 | 10.0 | 38.0 | 23.0 | 11.0 | 10.0 | 8.0 | |
| G15 | 6.0 | 35.0 | 17.0 | 34.0 | 8.0 | — | |

TABLE 1-continued

| Glass code | Li$_2$O (wt %) | MgO (wt %) | B$_2$O$_3$ (wt %) | SiO$_2$ (wt %) | ZnO (wt %) | Al$_2$O$_3$ (wt %) | Remarks |
|---|---|---|---|---|---|---|---|
| * G16 | 6.0 | 33.0 | 17.0 | 36.0 | 8.0 | — | |
| * G17 | 6.0 | 31.0 | 28.0 | 31.0 | 4.0 | — | |
| G18 | 6.0 | 31.0 | 26.0 | 31.0 | 6.0 | — | |
| G19 | 6.0 | 37.0 | 19.0 | 18.0 | 20.0 | — | |
| * G20 | 6.0 | 35.0 | 19.0 | 18.0 | 22.0 | — | |
| * G21 | 6.0 | 35.0 | 20.0 | 15.0 | 8.0 | 16.0 | |
| G22 | 6.0 | 35.0 | 20.0 | 16.5 | 8.0 | 14.5 | |
| G23 | 6.0 | 41.0 | 20.0 | 26.0 | 7.0 | — | |

In Table 1, the glass powders represented by glass codes marked with asterisks * have compositions outside the scope of the present invention.

The glass powders shown in Table 1 other than G8, G9, and G13, which were impossible or difficult to vitrify, were each pulverized to an average particle size of 1 to 2 μm. The borosilicate glass powders were thus prepared for insulating ceramic compositions.

Mg$_2$SiO$_4$ powder with an average particle size (center particle size D50) of 0.8 μm was prepared for use as the first ceramic powder of the insulating ceramic composition, and CaTiO$_3$ powder with an average particle size of 1.5 μm, SrTiO$_3$ powder with an average particle size of 1.5 μm, and TiO$_2$ powder with an average particle size of 1.0 μm were prepared for the second ceramic powder.

Then, the first ceramic powder, the borosilicate glass powder, and the second ceramic powder were mixed to prepare the insulating ceramic compositions shown in Table 2.

TABLE 2

| Sample number | First ceramic content (wt %) | Borosilicate glass | | Second ceramic | |
|---|---|---|---|---|---|
| | | Type | Content (wt %) | Type | Content (wt %) |
| * 1 | 70.0 | G1 | 20.0 | CT | 10.0 |
| 2 | 70.0 | G2 | 20.0 | CT | 10.0 |
| 3 | 85.0 | G3 | 3.0 | CT | 12.0 |
| * 4 | 85.0 | G4 | 3.0 | CT | 12.0 |
| * 5 | 77.0 | G5 | 15.0 | CT | 8.0 |
| 6 | 77.0 | G6 | 15.0 | CT | 8.0 |
| 7 | 74.0 | G7 | 15.0 | CT | 11.0 |
| 8 | 74.0 | G10 | 15.0 | CT | 11.0 |
| 9 | 76.0 | G11 | 15.0 | CT | 9.0 |
| * 10 | 76.0 | G12 | 15.0 | CT | 9.0 |
| 11 | 74.0 | G14 | 18.0 | CT | 8.0 |
| 12 | 74.0 | G15 | 18.0 | CT | 8.0 |
| * 13 | 74.0 | G16 | 18.0 | CT | 8.0 |
| * 14 | 75.0 | G17 | 15.0 | CT | 10.0 |
| 15 | 75.0 | G18 | 15.0 | CT | 10.0 |
| 16 | 79.0 | G19 | 20.0 | CT | 8.0 |
| * 17 | 85.0 | G20 | 2.0 | CT | 8.0 |
| * 18 | 66.5 | G21 | 19.0 | CT | 13.5 |
| 19 | 65.5 | G22 | 19.0 | CT | 14.5 |
| 20 | 80.0 | G23 | 9.0 | CT | 11.0 |
| 21 | 82.0 | G23 | 9.0 | ST | 9.0 |
| 22 | 65.0 | G23 | 10.0 | T | 25.0 |
| 23 | 80.0 | G23 | 9.0 | CT/T | 10.0/1.0 |
| 24 | 82.0 | G23 | 9.0 | ST/T | 8.7/0.3 |
| 25 | 84.0 | G23 | 9.0 | ST/T | 6.0/1.0 |
| 26 | 82.0 | G23 | 9.0 | ST/T | 8.0/1.0 |
| 27 | 80.0 | G23 | 9.0 | ST/T | 10.0/1.0 |
| 28 | 78.0 | G23 | 9.0 | ST/T | 12.0/1.0 |
| 29 | 81.0 | G23 | 9.0 | ST/T | 8.5/1.5 |
| 30 | 79.0 | G23 | 9.0 | ST/T | 8.5/3.5 |
| 31 | 77.0 | G23 | 9.0 | ST/T | 8.5/5.5 |
| 32 | 92.0 | G7 | 7.0 | T | 1.0 |
| 33 | 67.0 | G14 | 30.0 | T | 3.0 |

In Table 2, the samples marked with asterisks * are insulating ceramic compositions outside the scope of the present invention.

Also, in Table 2, the column of "First ceramic content" indicates the contents of Mg$_2$SiO$_4$ powder used as the first ceramic powder.

The column of "Type" in the "Borosilicate glass" field indicates glass codes shown in Table 1 of the glasses used and the column of "Content" in the same field indicates the borosilicate glass powder contents.

Also, the column of "Type" in the "Second ceramic" field shows which second ceramic powder of CaTiO$_3$ (=CT), SrTiO$_3$ (=ST), and TiO$_2$ (=T) was used, and the column of "Content" in the same field indicates the contents of the second ceramic powder used.

Then, 20 parts by weight of acrylic resin acting as a binder and 30 parts by weight of methyl ethyl ketone acting as a solvent were added to 100 parts by weight of each insulating ceramic composition of the samples shown in Table 2. The mixture was granulated and pressed into a columnar compact. The compact was fired at 1000° C. or less. Insulating ceramic sintered compact samples were thus prepared.

The samples were evaluated for their relative dielectric constant ($\in_r$), Qf value, temperature coefficient ($\tau_f$) of resonance frequency, and chemical stability, as shown in Table 3.

The $\in_r$, Qf, and $\tau_f$ values were measured by dielectric resonator method in which the sample size was adjusted so that the measurement frequency was 10 GHz. The chemical stability was evaluated using the samples that had been subjected to the measurements of $\in$r and Qf values, and determined was whether the Qf value of the sample was largely changed after PCT (pressure cooker test) at 120° C. and 95% relative humidity for 100 hours. In Table 3, when there was no large change, the chemical stability of the sample was determined to be good and represented by a circle; when there was a large change, the chemical stability of the sample was determined to be poor and represented by a cross.

TABLE 3

| Sample number | $\epsilon_r$ | Qf value (GHz) | $\tau_f$ (ppm · °C.$^{-1}$) | Chemical stability |
|---|---|---|---|---|
| * 1 | | Not sintered | | |
| 2 | 9.5 | 28000 | −5 | ○ |
| 3 | 11.2 | 10500 | +5 | ○ |
| * 4 | 9.8 | 8500 | −15 | x |
| * 5 | 9.1 | 4800 | −15 | ○ |
| 6 | 9.3 | 12000 | −12 | ○ |
| 7 | 10.5 | 41000 | +10 | ○ |
| 8 | 9.8 | 38000 | −10 | ○ |
| 9 | 8.8 | 22000 | +25 | ○ |
| * 10 | 8.4 | 4000 | +20 | x |
| 11 | 9.2 | 25000 | −25 | ○ |
| 12 | 7.8 | 23000 | −15 | ○ |
| * 13 | 7.7 | 5500 | −12 | ○ |
| * 14 | 10.5 | 25000 | −20 | x |
| 15 | 10.5 | 41000 | −22 | ○ |
| 16 | 8.9 | 41000 | −20 | ○ |
| * 17 | 8.9 | 36000 | −22 | x |
| * 18 | | Not sintered | | |
| 19 | 12.4 | 22000 | +18 | ○ |
| 20 | 10.5 | 52000 | −15 | ○ |
| 21 | 9.0 | 49000 | −14 | ○ |
| 22 | 12.5 | 45000 | −16 | ○ |
| 23 | 11.0 | 56000 | −6 | ○ |
| 24 | 8.8 | 53000 | −8 | ○ |
| 25 | 7.5 | 65000 | −30 | ○ |
| 26 | 8.0 | 60000 | −18 | ○ |
| 27 | 10.2 | 40000 | +5 | ○ |
| 28 | 11.2 | 32000 | +15 | ○ |
| 29 | 9.0 | 54000 | −8 | ○ |
| 30 | 9.5 | 55000 | −9 | ○ |
| 31 | 10.5 | 52000 | −11 | ○ |
| 32 | 6.7 | 120000 | −60 | ○ |
| 33 | 7.1 | 31000 | −70 | ○ |

The samples outside the scope of the present invention are marked with asterisks * in Table 3 as well.

The samples within the scope of the present invention shown in Tables 2 and 3 each contain a borosilicate glass within the scope of the invention shown in Table 1, $Mg_2SiO_4$ powder acting as the first ceramic powder, and the second ceramic powder containing at least one compound selected from the group consisting of $CaTiO_3$, $SrTiO_3$, and $TiO_2$, as clearly shown in the column of "Type" in the "Borosilicate glass" field in Table 2. Consequently, these samples can be fired at a temperature of 1000° C. or less, and exhibit superior chemical stability, high Qf values, and stable $\tau_f$ values.

On the other hand, Glass G1 shown in Table 1 contained less than 3 percent by weight of $Li_2O$, and accordingly Sample 1 shown in Tables 2 and 3 using this glass was not sintered at temperatures of 1000° C. or less. Glass G4 contained more than 15 percent by weight, and accordingly Sample 4 using this glass exhibited a low Qf value and poor chemical stability.

Glass G5 contained less than 30 percent by weight of MgO, and accordingly Sample 5 using this glass exhibited a low Qf value. Glass G8 contained more than 50 percent by weight of MgO, and accordingly not vitrified.

Glass G9 contained less than 15 percent by weight of $B_2O_3$, and was accordingly difficult to vitrify. Glass G12 contained more than 30 percent by weight of $B_2O_3$, and accordingly Sample 10 using this glass exhibited a low Qf value and poor chemical stability.

Glass G13 contained less than 10 percent by weight of $SiO_2$, and was accordingly not vitrified. Glass G16 contained more than 35 percent by weight of $SiO_2$, and accordingly Sample 13 using this glass exhibited a low Qf value.

Glass G17 contained less than 6 percent by weight of ZnO, and accordingly Sample 14 using this glass exhibited poor chemical stability. Glass G20 contained more than 20 percent by weight of ZnO, and accordingly Sample 17 using this glass exhibited poor chemical stability.

Glass G21 contained more than 15 percent by weight of $Al_2O_3$, and accordingly Sample 18 using this glass was not sintered at temperatures of 1000° C. or less.

EXPERIMENTAL EXAMPLE 2

Various types of ceramic powder mainly containing forsterite, having $MgO/SiO_2$ molar ratios, impurity contents, and average particle sizes (center particle size D50) shown in Table 4 were prepared as the first ceramic powder contained in the insulating ceramic composition.

The ceramic powder essentially composed of a first ceramic "F4" in Table 4 corresponds to the first ceramic powder used in Experimental Example 1. Impurity contents were measured by ICP (plasma emission spectrometry). The first ceramic powders contained the following impurities: $Al_2O_3$, $B_2O_3$, CaO, $Fe_2O_3$, $MnO_2$, NiO, $SnO_2$, SrO, ZnO, $P_2O_5$, $TiO_2$, $ZrO_2$, $Li_2O$, $Na_2O$, and/or $K_2O$.

TABLE 4

| First ceramic code | $MgO/SiO_2$ molar ratio | Impurity content (wt %) | Average grain size (µm) |
|---|---|---|---|
| * F1 | 1.90 | 1.6 | 0.7 |
| F2 | 1.93 | 2.1 | 0.8 |
| F3 | 1.95 | 1.9 | 0.7 |
| F4 | 2.00 | 1.8 | 0.8 |
| F5 | 2.03 | 1.6 | 0.8 |
| * F6 | 2.06 | 2.0 | 0.7 |
| F7 | 1.99 | 3.2 | 0.7 |
| F8 | 2.00 | 4.5 | 0.7 |
| * F9 | 1.99 | 5.8 | 0.8 |
| * F10 | 2.01 | 1.8 | 1.2 |

In Table 4, the first ceramic powder represented by first ceramic codes marked with asterisks * have conditions outside the preferred scope of the present invention.

In order to prepare insulating ceramic compositions according to the samples shown in Table 5, each of the first ceramic powders shown in Table 4 was mixed with a borosilicate glass powder and a second ceramic powder. In Table 5, the column of "Type" in the "First ceramic" field indicates codes shown in Table 4 of the first ceramic used, and the column of "Content" in the same field indicates the first ceramic powder contents.

TABLE 5

| | First ceramic | | Borosilicate glass | | Second ceramic | |
|---|---|---|---|---|---|---|
| Sample number | Type | Content (wt %) | Type | Content (wt %) | Type | Content (wt %) |
| 29(Reference) | F4 | 81.0 | G23 | 9.0 | ST/T | 8.5/1.5 |
| * 34 | F1 | 81.0 | G23 | 9.0 | ST/T | 8.5/1.5 |
| 35 | F2 | 81.0 | G23 | 9.0 | ST/T | 8.5/1.5 |
| 36 | F3 | 81.0 | G23 | 9.0 | ST/T | 8.5/1.5 |
| 37 | F5 | 81.0 | G23 | 9.0 | ST/T | 8.5/1.5 |
| * 38 | F6 | 81.0 | G23 | 9.0 | ST/T | 8.5/1.5 |
| 39 | F7 | 81.0 | G23 | 9.0 | ST/T | 8.5/1.5 |
| 40 | F8 | 81.0 | G23 | 9.0 | ST/T | 8.5/1.5 |
| * 41 | F9 | 81.0 | G23 | 9.0 | ST/T | 8.5/1.5 |
| * 42 | F10 | 81.0 | G23 | 9.0 | ST/T | 8.5/1.5 |

In Table 5, the samples marked with asterisks * are insulating ceramic compositions having conditions outside the preferred scope of the present invention, using first ceramic powders having conditions outside the preferred scope of the present invention as shown in Table 4.

In Experimental Example 2, Glass G23 shown in Table 1 that was pulverized to an average particle size of 1 to 2 μm was used as the borosilicate glass powder, as shown in the "Borosilicate glass" field in Table 5. The content of this glass was 9.0 percent by weight.

In Experimental Example 2, $SrTiO_3$ (=ST) powder with an average particle size of 1.5 μm and $TiO_2$ (=T) powder with an average particle size of 1.0 μm were used for the second ceramic powder, as shown in the column of "Type" in the "Second ceramic" field in Table 5. As shown in the column of "Content" in the same field, 8.5 percent by weight of ST powder and 1.5 percent by weight of T powder were added.

For ease of comparison, Table 5 shows Sample 29 shown in Table 2, again.

Then insulating ceramic sintered compact samples were prepared from the insulating ceramic composition samples shown in Table 5 in the same manner as in Experimental Example 1. The samples were evaluated for relative dielectric constant ($\epsilon_r$), Qf value, temperature coefficient ($\tau_f$) of resonance frequency, and chemical stability, as shown in Table 6.

TABLE 6

| Sample number | $\epsilon_r$ | Qf value (GHz) | $\tau_f$ (ppm · °C.$^{-1}$) | Chemical stability |
|---|---|---|---|---|
| 29(Reference) | 9.0 | 54000 | −8 | ○ |
| * 34 | 8.6 | 56000 | −12 | x |
| 35 | 8.7 | 55000 | −14 | ○ |
| 36 | 8.9 | 54000 | −10 | ○ |
| 37 | 9.2 | 51000 | −6 | ○ |
| * 38 | 9.3 | 45000 | −7 | x |
| 39 | 9.1 | 33000 | −6 | ○ |
| 40 | 9.3 | 14000 | −4 | ○ |
| * 41 | 9.4 | 8000 | 1 | x |
| * 42 | | | Not sintered | |

The samples outside the preferred scope of the present invention are marked with asterisks * in Table 6 as well.

Samples 35 to 37, 39, and 40 used any one of the first ceramic powders "F2", "F3", "F5", "F7", and "F8", which satisfy the requirements that the first ceramic powder has a $MgO/SiO_2$ molar ratio in the range of 1.92 to 2.04, an impurity content of 5 percent by weight or less, and an average particle size (center particle size D50) of 1 μm or less, as shown in Table 4. These samples produced evaluation results similar to those of Sample 29, as shown in Table 6.

On the other hand, Sample 34 used the first ceramic powder "F1" having a $MgO/SiO_2$ molar ratio of less than 1.92, and accordingly exhibited poor chemical stability. Sample 38 used the first ceramic powder "F6" having a $MgO/SiO_2$ molar ratio of more than 2.04, and accordingly exhibited poor chemical stability.

Sample 41 used the first ceramic powder "F9" containing more than 5 percent by weight of impurities, and accordingly exhibited a low Qf value and poor chemical stability.

Sample 42 used the first ceramic powder "F10" having an average particle size (center particle size D50) of more than 1 μm, and was accordingly not sintered at temperatures of 1000° C. or less.

EXPERIMENTAL EXAMPLE 3

Various types of ceramic powder with an average particle size of 1.5 μm, mainly containing $SrTiO_3$ having $SrO/TiO_2$ molar ratios, impurity contents, specific surface areas, and integrated intensities shown in Table 7 were used as part of the second ceramic powder contained in the insulating ceramic composition. The impurity contents shown in Table 7 were measured by ICP (plasma emission spectrometry). The integrated intensity was obtained from the diffraction peak of $SrTiO_3$ (222) by powder X-ray diffraction. The X-ray diffractometer used a Cu target at a tube voltage of 50 kV and a tube current of 250 mA, and the measurements were continuously performed at sampling width of 0.02°.

TABLE 7

| Second ceramic code | $SrO/TiO_2$ molar ratio | Impurities Constituent | Content (wt %) | Specific surface area (m$^2$/g) | Integrated intensity |
|---|---|---|---|---|---|
| * S1 | 1.07 | BaO, Fe$_2$O$_3$, Al$_2$O$_3$ | 0.15 | 4.5 | 2200 |
| S2 | 1.05 | BaO, Fe$_2$O$_3$, Al$_2$O$_3$ | 0.15 | 4.5 | 2200 |
| S3 | 1.02 | BaO, Fe$_2$O$_3$, Al$_2$O$_3$ | 0.15 | 4.5 | 2200 |
| S4 | 0.96 | BaO, Fe$_2$O$_3$, Al$_2$O$_3$ | 0.15 | 4.5 | 2200 |
| S5 | 0.92 | BaO, Fe$_2$O$_3$, Al$_2$O$_3$ | 0.15 | 4.5 | 2200 |
| * S6 | 0.90 | BaO, Fe$_2$O$_3$, Al$_2$O$_3$ | 0.15 | 4.5 | 2200 |
| S7 | 1.00 | BaO, Fe$_2$O$_3$, Al$_2$O$_3$ | 0.90 | 4.5 | 2200 |
| * S8 | 1.00 | BaO, Fe$_2$O$_3$, Al$_2$O$_3$ | 1.05 | 4.5 | 2200 |
| * S9 | 1.00 | Nb$_2$O$_5$, CaO, Na$_2$O, BaO | 1.50 | 3.0 | 2000 |
| * S10 | 1.00 | BaO, Fe$_2$O$_3$, Al$_2$O$_3$ | 0.15 | 1.3 | 2500 |
| S11 | 1.00 | BaO, Fe$_2$O$_3$, Al$_2$O$_3$ | 0.15 | 1.5 | 2350 |
| S12 | 1.00 | BaO, Fe$_2$O$_3$, Al$_2$O$_3$ | 0.15 | 5.5 | 2200 |
| S13 | 1.00 | BaO, Fe$_2$O$_3$, Al$_2$O$_3$ | 0.15 | 7.5 | 2000 |
| * S14 | 1.00 | BaO, Fe$_2$O$_3$, Al$_2$O$_3$ | 0.15 | 8.0 | 1500 |
| * S15 | 1.00 | BaO, Fe$_2$O$_3$, Al$_2$O$_3$ | 0.15 | 7.0 | 850 |
| S16 | 1.00 | BaO, Fe$_2$O$_3$, Al$_2$O$_3$ | 0.15 | 6.5 | 1200 |

In Table 7, the second ceramics marked with asterisks * were $SrTiO_3$-based ceramic powders having conditions outside the preferred scope of the present invention.

For the preparation of insulating ceramic compositions according to the samples shown in Table 8, each of the $SrTiO_3$-based ceramic powders "S1" to "S16" shown in Table 7 was mixed with $TiO_2$ (=T) powder with an average particle size of 1.0 μm, as shown in the column of "type" in the "Second ceramic" field in Table 8 at the ratio shown in the column of "Content" in the same field, and the resulting mixtures were used as the second ceramic powder.

For the preparation of the insulating ceramic compositions according to the samples shown in Table 8, Experimental Example 3 used a borosilicate glass powder essentially composed of Glass G23 shown in Table 1 that was pulverized to an average particle size of 1 to 2 μm, as shown in the column of "Type" in the "Borosilicate glass" field in Table 8. The content of this glass is shown in the column of "Content" in the same field.

In the preparation of the insulating ceramic compositions according to the samples shown in Table 8, Experimental Example 3 used a first ceramic powder essentially composed of the first ceramic "F4" shown in Table 4, as in Experimental Example 1. The content of this first ceramic is shown in the column of "First ceramic content" in Table 8.

TABLE 8

| Sample number | First ceramic content (wt %) | Type | Borosilicate glass Content (wt %) | Second ceramic Type | Content (wt %) |
|---|---|---|---|---|---|
| * 50 | 81 | G23 | 9.0 | S1/T | 8.5/1.5 |
| 51 | 81 | G23 | 9.0 | S2/T | 8.5/1.5 |
| 52 | 81 | G23 | 9.0 | S3/T | 8.5/1.5 |
| 53 | 81 | G23 | 9.0 | S4/T | 8.5/1.5 |
| 54 | 81 | G23 | 9.0 | S5/T | 8.5/1.5 |
| * 55 | 80.5 | G23 | 9.0 | S6/T | 9.0/1.5 |
| 56 | 81 | G23 | 9.0 | S7/T | 8.5/1.5 |
| * 57 | 81 | G23 | 9.0 | S8/T | 8.5/1.5 |
| * 58 | 81 | G23 | 9.0 | S9/T | 8.5/1.5 |
| * 59 | 81 | G23 | 9.0 | S10/T | 8.5/1.5 |
| 60 | 80 | G23 | 10.0 | S11/T | 8.5/1.5 |
| 61 | 81 | G23 | 9.0 | S12/T | 8.5/1.5 |
| 62 | 81 | G23 | 9.0 | S13/T | 8.5/1.5 |
| * 63 | 81 | G23 | 9.0 | S14/T | 8.5/1.5 |
| * 64 | 81 | G23 | 9.0 | S15/T | 8.5/1.5 |
| 65 | 81 | G23 | 9.0 | S16/T | 8.5/1.5 |

In Table 8, the samples represented by numbers marked with asterisks * are insulating ceramic compositions having conditions outside the preferred scope of the present invention, using second ceramic powders having conditions outside the preferred scope of the present invention, as shown in Table 7.

Then, insulating ceramic sintered compact samples were prepared from the insulating ceramic composition samples shown in Table 8 in the same manner as in Experimental Example 1. The samples were evaluated for their relative dielectric constant ($\epsilon_r$), Qf value, temperature coefficient ($\tau_f$) of resonance frequency, and chemical stability, as shown in Table 9.

TABLE 9

| Sample number | $\epsilon_r$ | Qf value (GHz) | $\tau_f$ (ppm · °C.$^{-1}$) | Chemical stability |
|---|---|---|---|---|
| * 50 | 8.8 | 9000 | −15.0 | x |
| 51 | 8.9 | 45000 | −8.0 | o |
| 52 | 9.0 | 47000 | −7.5 | o |
| 53 | 9.0 | 52000 | −8.0 | o |
| 54 | 8.8 | 51000 | −7.5 | o |
| * 55 | 9.1 | 55000 | −12.0 | o |
| 56 | 8.9 | 20000 | −10.0 | o |
| * 57 | 8.9 | 8500 | −10.5 | o |
| * 58 | 9.1 | 6000 | −9.5 | o |
| * 59 | | | Not sintered | |
| 60 | 8.8 | 41000 | −10.0 | o |
| 61 | 9.0 | 51000 | −8.0 | o |
| 62 | 9.1 | 49000 | 3.0 | o |
| * 63 | 9.3 | 9000 | 5.0 | o |
| * 64 | 9.3 | 7500 | −15.0 | x |
| 65 | 9.2 | 20000 | −9.0 | o |

The samples outside the preferred scope of the present invention are marked with asterisks * in Table 9 as well.

Samples 51 to 54, 56, 60 to 62, and 65 used any one of the SrTiO$_3$-based ceramic powders "S2", "S3", "S4", "S5", "S7", "S11", "S12", "S13", and "S16" shown in Table 7 as part of the second ceramic powder. These ceramic powders satisfy the requirements that the SrTiO$_3$-based ceramic powder has a SrO/TiO$_2$ molar ratio in the range of 0.92 to 1.05, an impurity content of 1 percent by weight or less, and a specific surface area in the range of 1.5 to 7.5 m$^2$/g, and exhibits an X-ray diffraction pattern having a peak of the SrTiO$_3$ (222) plane with an integrated intensity of 1000 or more. These samples produced satisfactory results as shown in Table 9.

On the other hand, Sample 50 used the second ceramic powder "S1" having a SrO/TiO$_2$ molar ratio of more than 1.05, and accordingly exhibited a low Qf value and poor chemical stability.

Sample 55 used the second ceramic powder "S6" having a SrO/TiO$_2$ molar ratio of less than 0.92, but did not exhibit any characteristic leading to a problem. This is because Experimental Example 3 additionally used TiO$_2$ for the second ceramic powder and the proportion of SrTiO$_3$ and TiO$_2$ was adjusted. However, the adjustment of the proportion is generally troublesome.

Samples 57 and 58 respectively used the second ceramic powders "S8" and "S9" containing more than 1 percent by weight of impurities, and accordingly exhibited low Q values.

Sample 59 used the second ceramic powder "S10" having a specific surface area of less than 1.5 m$^2$/g, and was accordingly not sintered at temperatures of 1000° C. or less. Sample 63 used the second ceramic powder "S14" having a specific surface area of more than 7.5 m$^2$/g, and accordingly exhibited a low Q value.

Sample 64 used the second ceramic powder "S15" having an integrated intensity of less than 1000, and accordingly exhibited a low Q value and poor chemical stability.

EXPERIMENTAL EXAMPLE 4

In order to prepare insulating ceramic composition samples shown in Table 10, a first ceramic powder, a borosilicate glass powder, a second ceramic powder, and third ceramic powders were prepared and mixed.

In Table 10, the first ceramic powder "F4" shown in the column of "Type" in the "First ceramic" field in Table 4 was used as the first ceramic powder. The content of this ceramic powder was shown in the column of "Content" in the same field.

Glass G6 or G23 shown in Table was used as the borosilicate glass powder, as shown in the column of "Type" in the "Borosilicate glass" field in Table 10. The content of this glass was shown in "Content" in the same field.

"CT" (CaTiO$_3$) or "ST/T" (SrTiO$_3$/TiO$_2$) was used as the second ceramic powder, as shown in the column of "Type" in the "Second ceramic field" in Table 10. The content of the second ceramic powder was shown in the column of "Content" in the same field.

As for the third ceramic powder, at least one compound selected from among CuO powder, Fe$_2$O$_3$ powder, and MnO$_2$ powder was added in predetermined proportions as shown in the "Third ceramic" field in Table 10. In this instance, the CuO powder had an average particle size of 1.1 μm; the Fe$_2$O$_3$ powder had an average particle size of 0.9 μm; and the MnO powder had an average particle size of 1.2 μm. The contents shown in the columns of "CuO", "Fe$_2$O$_3$", "MnO$_2$", and "Total" in the "Third ceramic" field in Table 10 are each represented in terms of weight ratio relative to 100 parts by weight in total of the first ceramic powder, the borosilicate glass powder, and the second ceramic powder.

TABLE 10

| Sample number | First ceramic Type | First ceramic Content (wt %) | Borosilicate glass Type | Borosilicate glass Content (wt %) | Second ceramic Type | Second ceramic Content (wt %) | Third ceramic CuO (Part by weight) | Third ceramic $Fe_2O_3$ (Part by weight) | Third ceramic $MnO_2$ (Part by weight) | Third ceramic Total (Part by weight) |
|---|---|---|---|---|---|---|---|---|---|---|
| 6(Reference) | F4 | 77.0 | G6 | 15.0 | CT | 8.0 | 0 | 0 | 0 | 0 |
| 66 | F4 | 78.0 | G6 | 14.0 | CT | 8.0 | 0.1 | 0 | 0 | 0.1 |
| 67 | F4 | 79.0 | G6 | 13.0 | CT | 8.0 | 0.3 | 0 | 0 | 0.3 |
| * 68 | F4 | 80.0 | G6 | 12.0 | CT | 8.0 | 0.8 | 0 | 0 | 0.8 |
| 69 | F4 | 78.0 | G6 | 14.0 | CT | 8.0 | 0 | 0.2 | 0 | 0.2 |
| 70 | F4 | 79.0 | G6 | 13.0 | CT | 8.0 | 0 | 0.6 | 0 | 0.6 |
| * 71 | F4 | 80.0 | G6 | 12.0 | CT | 8.0 | 0 | 1.5 | 0 | 1.5 |
| 72 | F4 | 78.0 | G6 | 14.0 | CT | 8.0 | 0 | 0 | 0.5 | 0.5 |
| 73 | F4 | 79.0 | G6 | 13.0 | CT | 8.0 | 0 | 0 | 1.5 | 1.5 |
| * 74 | F4 | 80.0 | G6 | 12.0 | CT | 8.0 | 0 | 0 | 2.5 | 2.5 |
| 75 | F4 | 78.0 | G6 | 14.0 | CT | 8.0 | 0.1 | 0.5 | 0.5 | 1.1 |
| 76 | F4 | 79.0 | G6 | 13.0 | CT | 8.0 | 0.2 | 0.8 | 1.0 | 2.0 |
| * 77 | F4 | 80.0 | G6 | 12.0 | CT | 8.0 | 0.3 | 1.0 | 1.5 | 2.8 |
| 29(Reference) | F4 | 81.0 | G23 | 9.0 | ST/T | 8.5/1.5 | 0 | 0 | 0 | 0 |
| 78 | F4 | 82.0 | G23 | 8.0 | ST/T | 8.5/1.5 | 0.1 | 0 | 0 | 0.1 |
| 79 | F4 | 82.0 | G23 | 8.0 | ST/T | 8.5/1.5 | 0 | 0.2 | 0 | 0.2 |
| 80 | F4 | 82.0 | G23 | 8.0 | ST/T | 8.5/1.5 | 0 | 0 | 0.5 | 0.5 |

In Table 10, the samples marked With asterisks * are insulating ceramic compositions having third ceramic powder contents outside the preferred range according to the present invention.

For ease of comparison, Table 10 shows Sample 6 shown in Table 3 and Sample 29 shown in Table 2, again.

Then, insulating ceramic sintered compact samples were prepared from the insulating ceramic composition samples shown in Table 10 in the same manner as in Experimental Example 1. The samples were evaluated for relative dielectric constant ($\in_r$), Qf value, temperature coefficient ($\tau_f$) of resonance frequency, and chemical stability, as shown in Table 11.

TABLE 11

| Sample number | $\epsilon_r$ | Qf value (GHz) | $\tau_f$ (ppm · ° $C.^{-1}$) | Chemical stability |
|---|---|---|---|---|
| 6(Reference) | 9.3 | 12000 | −12 | ○ |
| 66 | 9.3 | 16000 | −10 | ○ |
| 67 | 9.5 | 13000 | −6 | ○ |
| * 68 | 9.5 | 8000 | −3 | ○ |
| 69 | 9.3 | 17000 | −9 | ○ |
| 70 | 9.4 | 14000 | −2 | ○ |
| * 71 | 9.6 | 7000 | 5 | ○ |
| 72 | 9.4 | 16000 | −5 | ○ |
| 73 | 9.6 | 14000 | 3 | ○ |
| * 74 | 9.8 | 8000 | 9 | ○ |
| 75 | 9.5 | 14000 | −4 | ○ |
| 76 | 9.6 | 12000 | 2 | ○ |
| * 77 | 9.8 | 7000 | 10 | ○ |
| 29(Reference) | 9.0 | 54000 | −8 | ○ |
| 78 | 9.0 | 57000 | −6 | ○ |
| 79 | 9.1 | 58000 | −6 | ○ |
| 80 | 9.1 | 57000 | −4 | ○ |

The samples having third ceramic contents shown in Table 10 outside the preferred range according to the present invention are marked with asterisks * in Table 11 as well.

The third ceramic powder serves as a sintering agent. By adding the third ceramic powder, the borosilicate glass powder contend can be reduced, and the first ceramic powder content can be increased accordingly. Consequently, the Qf value can be increased in comparison with the case where the third ceramic powder is not added.

More specifically, as shown in Table 11, Samples 66, 67, 69, 70, 72, 73, 75, and 76 exhibited Qf values of 10000 GHz or more, higher than Sample 6 not containing the third ceramic powder; Samples 78 to 80 exhibited such Qf values higher than Sample 29 not containing the third ceramic powder. These samples also exhibited resonance frequencies with stable temperature coefficients ($\tau_f$) within ±30 ppm·° $C.^{-1}$.

The Samples 66, 67, 69, 70, 72, 73, 75, 76, and 78 to 80 satisfy the requirements that they have a CuO content of 0.5 parts by weight or less, a $Fe_2O_3$ content of 1 part by weight or less, and a $MnO_2$ content of 2 parts by weight or less, relative to 100 parts by weight in total of the first ceramic powder, the borosilicate glass powder, and the second ceramic powder while the total third ceramic powder content is 2.5 parts by weight or less.

On the other hand, Samples 68, 71, 74, and 77 each had a third ceramic powder content beyond the upper limit, and accordingly exhibited lower Qf values than Sample 6.

The invention claimed is:

1. An insulating ceramic composition comprising:
    a first ceramic powder comprising forsterite as a main component;
    a second ceramic powder comprising at least one ceramic powder selected from the group consisting of a calcium titanate-based ceramic powder mainly containing calcium titanate, a strontium titanate-based ceramic powder mainly containing strontium titanate, and a titanium oxide-based ceramic powder mainly containing titanium oxide; and
    borosilicate glass powder,
    wherein the borosilicate glass contains 3 to 15 percent by weight of lithium in terms of $Li_2O$, 30 to 50 percent by weight of magnesium in terms of MgO, 15 to 30 percent by weight of boron in terms of $B_2O_3$, 10 to 35 percent by weight of silicon in terms of $SiO_2$, 6 to 20 percent by weight of zinc in terms of ZnO, and 0 to 15 percent by weight of aluminum in terms of $Al_2O_3$.

2. The insulating ceramic composition according to claim 1, wherein the borosilicate glass powder content is 3 to 20 percent by weight.

3. The insulating ceramic composition according to claim 1, wherein the first ceramic powder content is 70 percent by weight or more, and the second ceramic powder content is 6 to 30 percent by weight.

4. The insulating ceramic composition according to claim 1, further comprising a third ceramic powder including at least one ceramic powder selected from the group consisting of a copper oxide-based ceramic powder mainly containing copper oxide (CuO), an iron oxide-based ceramic powder mainly containing iron oxide ($Fe_2O_3$), and a manganese oxide-based ceramic powder 39 mainly containing manganese oxide ($MnO_2$),
wherein the third ceramic powder has a total content of 2.5 parts by weight or less relative to 100 parts by weight in total of the first ceramic powder the second ceramic powders, and the borosilicate glass powder and a copper oxide-based ceramic powder content of 0.5 parts by weight or less, an iron oxide-based ceramic powder content of 1 part by weight or less, and a manganese oxide-based ceramic powder content of 2 parts by weight or less.

5. The insulating ceramic composition according to claim 1, wherein the borosilicate glass has a composition from which a $Li_2(Mg, Zn)SiO_4$ crystal phase can be separated.

6. The insulating ceramic composition according to claim 1, wherein the forsterite has a $MgO/SiO_2$ molar ratio in the range of 1.92 to 2.04.

7. The insulating ceramic composition according to claim 6, wherein the first ceramic powder contains 5 percent by weight or less of impurities apart from the forsterite.

8. The insulating ceramic composition according to claim 1, wherein the first ceramic powder has a center particle size D50 of 1 µm or less.

9. The insulating ceramic composition according to claim 1, wherein the second ceramic powder contains the strontium titanate-based ceramic powder and the titanium oxide-based ceramic powder.

10. The insulating ceramic composition according to claim 9, wherein the strontium titanate-based ceramic powder content is 6 to 13 percent by weight and the titanium oxide-based ceramic powder content is 0.5 to 5.5 percent by weight.

11. The insulating ceramic composition according to claim 1, wherein the second ceramic powder contains the strontium titanate-based ceramic powder, and the strontium titanate has a $SrO/TiO_2$ molar ratio in the range of 0.92 to 1.05.

12. The insulating ceramic composition according to claim 11, wherein the strontium titanate-based ceramic powder contains 1 percent by weight or less of impurities apart from the strontium titanate.

13. The insulating ceramic composition according to claim 11, wherein the strontium titanate-based ceramic powder has a specific surface area of 1.5 to 7.5 $m^2/g$.

14. The insulating ceramic composition according to claim 11, wherein the strontium titanate-based ceramic powder exhibits an X-ray diffraction pattern having a peak of the $SrTiO_3$ (222) plane with an integrated intensity of 1000 or more.

15. A insulating ceramic sintered compact comprising a insulating ceramic composition according to claim 1.

16. A monolithic ceramic electronic component comprising a plurality of stacked insulating ceramic layers according to claim 15; and a wiring conductor comprising copper or silver associated therewith.

17. The monolithic ceramic electronic component according to claim 16, further comprising a highly dielectric ceramic layer having a relative dielectric constant of 15 or more stacked with an insulating ceramic layer.

18. The monolithic ceramic electronic component according to claim 17, wherein the highly dielectric ceramic layers comprise a highly dielectric material containing:
a main constituent expressed by $x(Ba_aCa_bSr_c)O-y\{(TiO_2)_{1-m}(ZrO_2)_m\}-zRe_2O_3$ (wherein x, y, and z are in mol % and satisfy x+y+z=100; a+b+c=1, $0 \leq b+c < 0.8$, and $0 \leq m < 0.15$ hold; and Re represents at least one of rare earth elements), containing $(Ba_aCa_bSr_c)O$, $\{(TiO_2)_{1-m}(ZrO_2)_m\}$, and $Re_2O_3$ in a molar ratio (x, y, z) lying in an area surrounded by lines connecting points A(7, 85, 8), B(7, 59, 34), C(0, 59, 41), and D(0, 85, 15) in a ternary diagram but not lying on the line connecting points A and B;
a first accessory constituent including $SiO_2$-based glass; and
a second accessory constituent containing Mn,
wherein the highly dielectric material contains 0.1 to 25 parts by weight of the first accessory constituent and 0.5 to 20 parts by weight of the second accessory constituent in terms of Mn, relative to 100 parts by weight of the main constituent.

19. The monolithic ceramic electronic component according to claim 18, wherein the highly dielectric material further contains $Li_2O$.

20. The monolithic ceramic electronic component according to claim 17, wherein the highly dielectric ceramic layer comprise a highly dielectric material containing:
a $BaO-TiO_2-ReO_{3/2}$-based ceramic composition expressed by $xBaO-yTiO_2-zReO_{3/2}$ (wherein x, y, and z are in mol % and satisfy x+y+z=100; $8 \leq x \leq 18$, $52.5 \leq y \leq 65$, and $20 \leq z \leq 40$ hold; and Re represents at least one of rare earth elements); and
a glass composition containing 10 to 25 percent by weight of $SiO_2$, 10 to 40 percent by weight of $B_2O_3$, 25 to 55 percent by weight of MgO, 0 to 20 percent by weight of ZnO, 0 to 15 percent by weight of $Al_2O_3$, 0.5 to 10 percent by weight of $Li_2O$, and 0 to 10 percent by weight of RO (wherein R represents at least one selected from among Ba, Sr, and Ca).

21. The monolithic ceramic electronic component according to claim 18, wherein the highly dielectric ceramic layers have a relative dielectric constant of 15 or more and contain $Li_2O$, and wherein a highly dielectric ceramic layer is sandwiched between adjacent layers of fired insulating ceramic layers.

22. The insulating ceramic composition according to claim 3, wherein the borosilicate glass powder content is 3 to 20 percent by weight, contains lithium in an amount of 4 to 10 percent by weight in terms of $Li_2O$, 30 to 45 percent by weight of magnesium in terms of MgO, 15 to 25 percent by weight of boron in terms of $B_2O_3$, greater than 0 up to 10 percent by weight of aluminum in terms of $Al_2O_3$, and has a composition from which a $Li_2(Mg, Zn)SiO_2$ crystal phase can be separated; the first ceramic powder has a center particle size D50 of 1 µm or less and contains at least 95 percent by weight of forsterite having a $MgO/SiO_2$ molar ratio in the range of 1.92 to 2.04; and the second ceramic powder contains 0.5 to 5.5 percent by weight of titanium oxide-based ceramic powder content and 6 to 13 percent by weight of strontium titanate-based ceramic powder having a $SrO/TiO_2$ molar ratio in the range of 0.92 to 1.05 and 1 percent by weight or less of impurities and a specific surface area of 1.5 to 7.5 $m^2/g$ and exhibiting an X-ray diffraction pattern having a peak of the $SrTiO_3$ (222) plane with an integrated intensity of 1000 or more.

* * * * *